(12) United States Patent
Muto

(10) Patent No.: US 7,656,262 B2
(45) Date of Patent: Feb. 2, 2010

(54) BALUN TRANSFORMER, MOUNTING STRUCTURE OF BALUN TRANSFORMER, AND ELECTRONIC APPARATUS HAVING BUILT-IN MOUNTING STRUCTURE

(75) Inventor: Akira Muto, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/031,024

(22) Filed: Feb. 14, 2008

(65) Prior Publication Data

US 2008/0197963 A1    Aug. 21, 2008

(30) Foreign Application Priority Data

Feb. 15, 2007  (JP)  ............... 2007-034865

(51) Int. Cl.
*H01F 5/00* (2006.01)
*H01F 27/28* (2006.01)
*H01F 21/02* (2006.01)

(52) U.S. Cl. ............... 336/200; 336/223; 336/232; 336/147; 336/186

(58) Field of Classification Search ............... None
See application file for complete search history.

(56) References Cited

U.S. PATENT DOCUMENTS

| | | | | |
|---|---|---|---|---|
| 4,916,410 A * | 4/1990 | Littlefield | ............... | 330/295 |
| 5,521,573 A * | 5/1996 | Inoh et al. | ............... | 336/180 |
| 6,054,914 A * | 4/2000 | Abel et al. | ............... | 336/200 |
| 6,448,879 B1* | 9/2002 | Kitamura | ............... | 336/200 |
| 6,903,643 B2* | 6/2005 | Lee et al. | ............... | 336/200 |
| 7,327,131 B2* | 2/2008 | Ezzeddine | ............... | 323/355 |
| 2001/0040495 A1* | 11/2001 | Morikawa | ............... | 336/223 |
| 2002/0171529 A1* | 11/2002 | Tang | ............... | 336/200 |
| 2003/0151881 A1* | 8/2003 | Yue | ............... | 361/268 |
| 2004/0012474 A1* | 1/2004 | Hwu et al. | ............... | 336/200 |
| 2007/0120637 A1* | 5/2007 | Ezzeddine | ............... | 336/200 |
| 2007/0126544 A1* | 6/2007 | Wotherspoon et al. | ............... | 336/200 |
| 2008/0231388 A1 | 9/2008 | Kaehs | | |

FOREIGN PATENT DOCUMENTS

| | | |
|---|---|---|
| JP | 09-330816 | 12/1997 |
| JP | 10-200360 | 7/1998 |
| JP | 2002-075742 | 3/2002 |
| JP | 2002-151341 | 5/2002 |

(Continued)

OTHER PUBLICATIONS

A Japanese Office Action dated Jan. 29, 2009 issued in connection with counterpart Japanese Patent Application No. 2007-034865.

*Primary Examiner*—Elvin G Enad
*Assistant Examiner*—Mangtin Lian
(74) *Attorney, Agent, or Firm*—Sonnenschein Nath & Rosenthal LLP

(57) ABSTRACT

There is provided a balun transformer, in which first to fourth layer coils are stacked and coupled magnetically; one end of each coil of the first to fourth layer coils is grounded; the second and third layer coils are connected in parallel, an unbalanced signal is input/output to/from a common terminal of the second and third layer coils; a first balanced signal is input/output to/from the other end of the first layer coil; and a second balanced signal is input/output to/from the other end of the fourth layer coil.

14 Claims, 17 Drawing Sheets

FOREIGN PATENT DOCUMENTS

| | | |
|---|---|---|
| JP | 2002-151342 | 5/2002 |
| JP | 2002-190410 | 7/2002 |
| JP | 2002-329611 | 11/2002 |
| JP | 2003-007538 | 1/2003 |
| JP | 2003-008312 | 1/2003 |
| JP | 2003-033216 | 2/2003 |
| JP | 2004-063760 | 2/2004 |
| JP | 2005-005595 | 1/2005 |
| JP | 2000-058328 | 2/2005 |
| JP | 2005-064358 | 3/2005 |
| JP | 2005-306696 | 11/2005 |
| JP | 2006-245273 | 9/2006 |
| JP | 2007-536839 | 12/2007 |

* cited by examiner

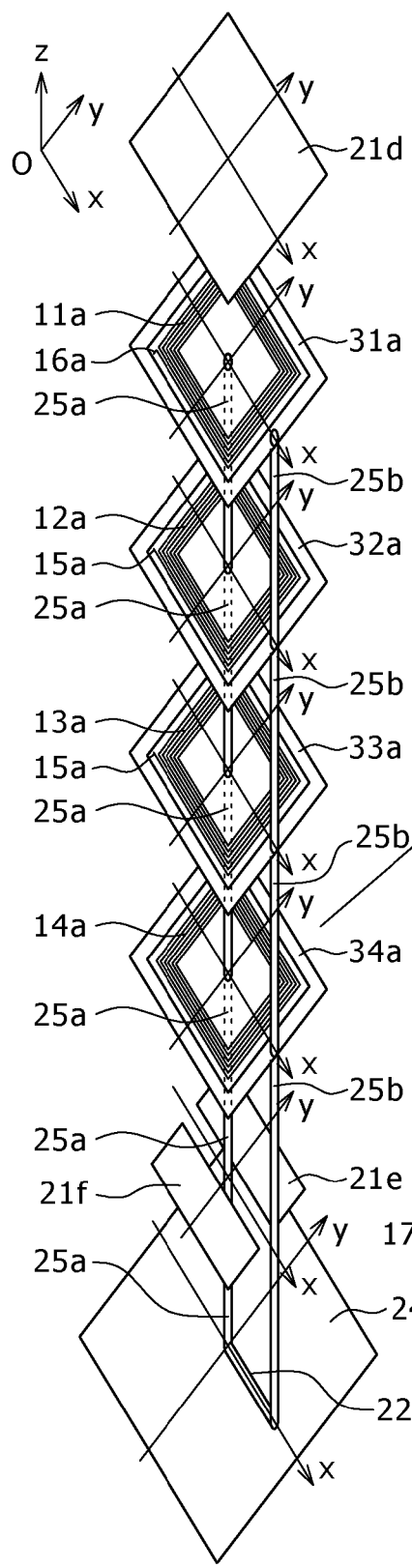
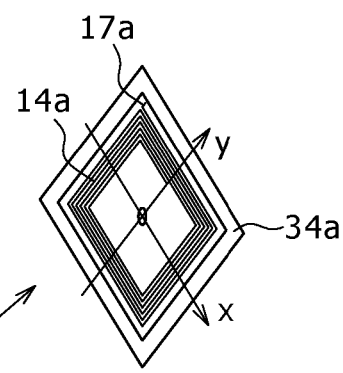
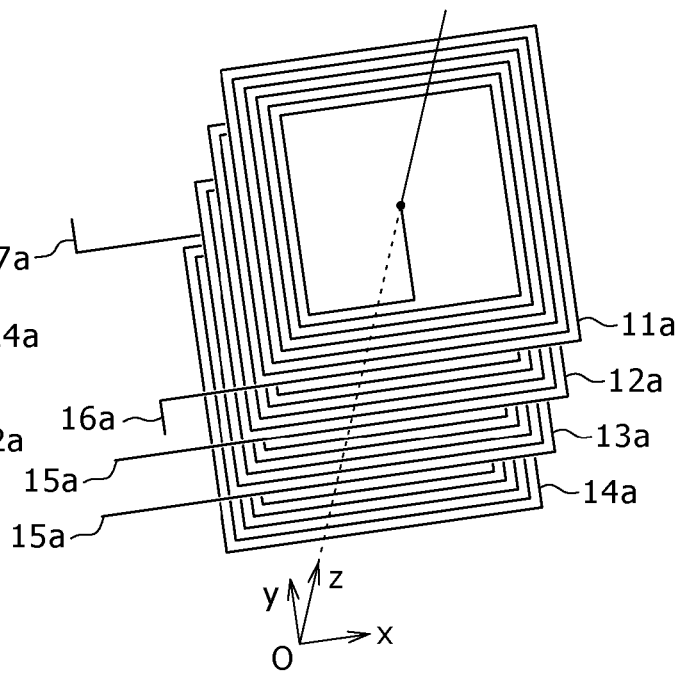
FIG. 5A
ONLY PLANE INCLUDING FOURTH COIL
FIG. 5B

PHASE OF BALANCED OUTPUT

PASS CHARACTERISTICS

FIG.11A1
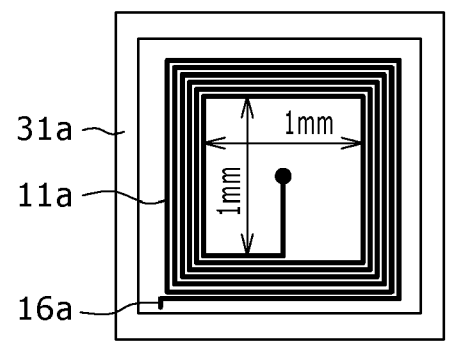
FIG.11A2
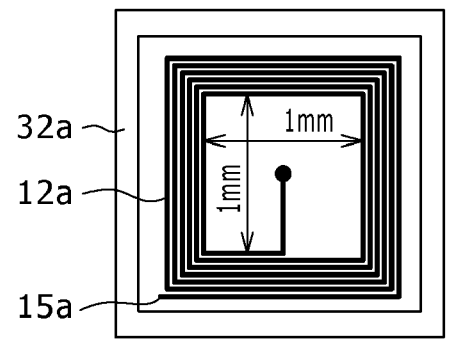
FIG.11A3
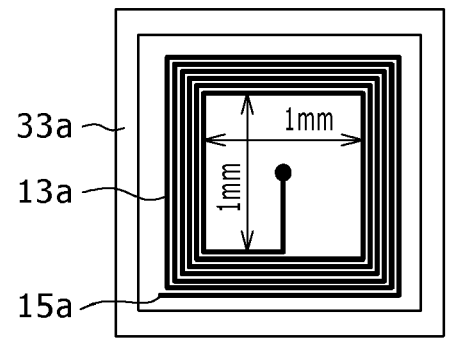
FIG.11A4
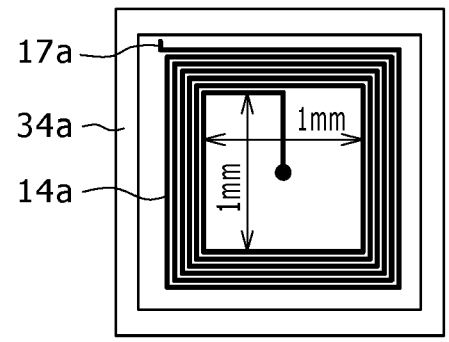

FIG. 11B1
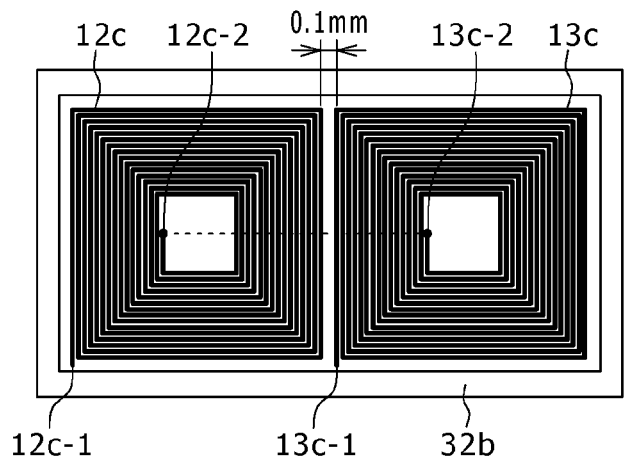
FIG. 11B2
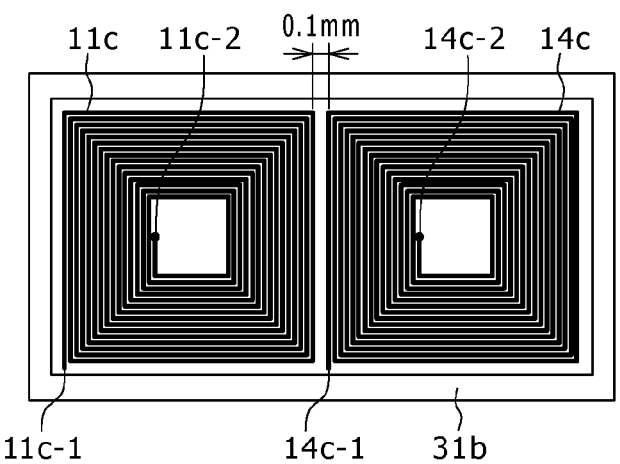
FIG. 11B3
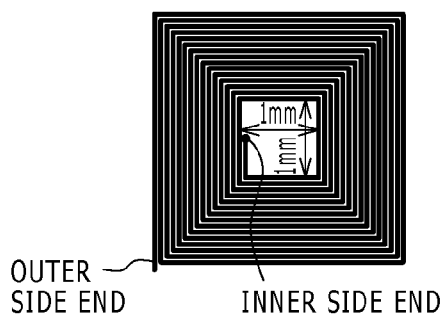
FIG. 11B4
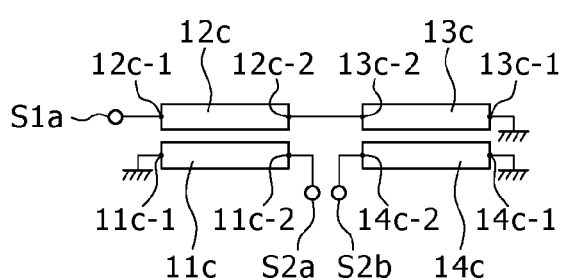

US 7,656,262 B2

BALUN TRANSFORMER, MOUNTING STRUCTURE OF BALUN TRANSFORMER, AND ELECTRONIC APPARATUS HAVING BUILT-IN MOUNTING STRUCTURE

BACKGROUND OF THE INVENTION

1. Field of the Invention

The present invention relates to a balun transformer used for a balance-unbalance signal converter for converting balanced signals into an unbalanced signal and vice versa, a phase converter and the like, and more particularly to a compact, broadband balun transformer and a mounting structure for a balun transformer and an electronic apparatus having a built-in mounting structure.

2. Description of Related Art

A balun transformer is used, for example, as a converter for converting balanced signals into an unbalanced signal or vice versa. Balanced lines have a pair of signal lines, and a balanced signal is propagated as a potential difference between paired signal lines. An unbalanced line is used for an unbalanced signal propagated as a potential at one signal line relative to a ground potential. As an unbalanced signal is input to an unbalanced terminal of a balun transformer, two balanced signals having a phase difference (opposite phases) of 180° and the same amplitude are output from balanced terminals of the balun transformer. A mobile communication apparatus such as a portable phone uses the balun transformer as a balance-unbalance signal converter. The balun transformer is also called a balun and a balun circuit.

There are many reports on a balun transformer.

The following description is given in Patent Document 1: Japanese Patent Application Publication No. 2000-58328 (paragraphs 0010 and 0011) titled "Stacked Type Balun Transformer".

The stacked type balun transformer regarding the invention described in Patent Document 1 includes at least a pair of first and second strip lines electromagnetically coupled via a dielectric layer and facing each other in a magnetically coupled area and a pair of third and fourth strip lines electromagnetically coupled via a dielectric layer and facing each other in an magnetically coupled area. The two pairs of strip lines are stacked with a dielectric layer in between, and a ground electrode facing the strip line is stacked having a dielectric layer in between at least one of a position between the two pairs of strip lines, a position above the two pairs of strip lines, and a position under the two pairs of strip lines. One end of the first strip line and one end of the fourth strip line are electrically connected; the other end of the first strip line is electrically connected to an input/output external electrode; the other end of the fourth strip line is opened; one end of the second strip line is electrically connected to the input/output external electrode and the other end thereof is electrically connected to the ground electrode; and one end of the third strip line is electrically connected to the input/output external electrode and the other end thereof is electrically connected to the ground electrode.

With this structure, each strip line is not juxtaposed on the same dielectric layer, but each strip line is stacked with a dielectric layer positioned in between so that a balun transformer of a small area can be realized. Further, a thickness of the dielectric layer sandwiched between the pair of strip lines electromagnetically coupled can be adjusted independently from the dielectric layer sandwiched between the other pair of strip lines.

The following description is given in Patent Document 2: Japanese Patent Application Publication No. 2003-7538 (paragraphs 0019 and 0020, paragraphs 0024 and 0025, FIG. 3) titled "Stacked Type Balun Transformer".

FIG. 15 of the present specification corresponds to FIG. 3 of Patent Document 2, and is an electrical equivalent circuit of the first embodiment of the stacked type balun transformer of Patent Document 2.

A balanced signal terminal 242a is electrically connected to one end of a first line 225, a balanced signal terminal 242b is connected to one end of a second line 228, and a relay terminal 243 is electrically connected to ends of a third line 224 and a fourth line 227.

In the balun transformer 221, the third and first lines 224 and 225 are disposed between the ground electrodes to constitute a strip line structure. The fourth and second lines 227 and 228 are also disposed between the ground electrodes to constitute a strip line structure. The third and fourth lines 224 and 227 are serially connected via the relay terminal to constitute an unbalanced transmission line 238. The first and second lines 225 and 228 constitute balanced transmission lines 239 and 239. The lines 224 and 225 and the lines 227 and 228 are formed facing each other with a dielectric sheet being interposed therebetween.

Although one end of the unbalanced transmission line 238 (specifically, at the end of the line 227) is opened, this end may be set as a ground end. The balun transformer 221 has upper and lower ground electrodes so that the shielding effect is provided.

Next, with reference to FIG. 15, description will be made on a case in which the balun transformer 221 is used as a balance-unbalance signal converter. As an unbalanced signal S1 is input to the unbalanced signal terminal 241, the unbalanced signal S1 propagates the unbalanced transmission line 238 (line 224-relay terminal 243-line 227). The line 224 line-couples the line 225, and the line 227 line-couples the line 228. Therefore, the unbalanced signal S1 is converted into balanced signals S2 which are output from the balanced signal terminals 242a and 242b. Conversely, as the balances signals S2 are input to the balanced signal terminals 242a and 242b, the balanced signals S2 propagates the balanced transmission lines 239 and 239 and converted into the unbalanced signal S1 at the unbalanced transmission line 238 which is then output from the unbalanced signal terminal 241.

The following description is given in Patent Document 3: Japanese Patent Application Publication No. 2003-8312 (paragraphs 0003 to 0006, paragraphs 0013 to 0015, FIGS. 1 to 3) titled "Balun Transformer".

FIGS. 16A to 16C of the present specification correspond to FIGS. 1 to 3 of Patent Document 3. FIG. 16A is a circuit diagram of a balun transformer according to an embodiment of the invention of Patent Document 3, and FIGS. 16B and 16C are circuit diagrams showing examples of an existing balun transformer.

Some of balun transformers interconnecting an unbalanced transmission line and balanced transmission lines to transmit a high frequency signal use distributed constant transmission lines. Examples of an existing balun transformer of this type are shown in the circuit diagrams of FIGS. 16B and 16C.

In FIGS. 16B and 16C, a first transmission line 310 has a length of about a quarter wavelength or shorter of a high frequency signal. A second transmission line 311 having a length of about a quarter wavelength or shorter is disposed parallel to the first transmission line 310 on the same plane or three-dimensionally parallel to the first transmission line and electromagnetically coupled to the first transmission line. An input terminal IN is an unbalanced terminal provided to the first transmission line 310, and output terminals OUT1 and OUT2 are balanced terminals provided to opposite ends of the second transmission line 311. In the example shown in FIG. 16B, a center of the second transmission line 311 is grounded, and in the example shown in FIG. 16C, the second transmission line 311 is not grounded.

As shown in FIGS. 16B and 16C, a balun transformer constituted of existing transmission lines uses the first transmission line 310 whose one end is used as unbalanced input terminal IN and whose other end is grounded, and the second transmission line 311 whose opposite ends are used as the balanced output terminals OUT1 and OUT2, and has either the structure that the center of the second transmission line 311 is grounded as shown in FIG. 16B or the structure that the second transmission line 311 is not grounded as shown in FIG. 16C.

The existing balun transformer of this type is, however, associated with the following problem. If an unbalanced signal is input to the unbalanced signal input terminal IN of the balun transformer, in the examples shown in FIGS. 16B and 16C, the positional relation between the input terminal IN and output terminal OUT1 are in a proximity positional relation so that the input terminal IN and output terminal OUT1 are capacitively coupled. Therefore, a phase shift from the opposite phases and an amplitude level difference between two balanced signals picked up from the output terminals OUT1 and OUT2 of the balun transformer become larger as the frequency becomes higher.

FIG. 16A is a circuit diagram showing an example of the balun transformer of the embodiment of Patent Document 3. In FIG. 16A, a first transmission line 301 has a length of about a quarter wavelength or shorter of a high frequency signal. A second transmission line 302 and a third transmission line 303 having a length of about a ⅛ wavelength or shorter are disposed parallel to the first transmission line 301 on the same plane or three-dimensionally parallel to and straight to the first transmission line and electromagnetically coupled to the first transmission line. An unbalanced terminal IN as an input terminal of an unbalanced signal is provided at one end of the first transmission line 301. Balanced terminals OUT1 and OUT2 for balanced signals are provided to confronting ends of the second and third transmission lines 302 and 303. The first transmission line 301 has the unbalanced terminal IN at its one end, and the other end is grounded. The second and third balanced lines 302 and 303 have the balanced terminals OUT1 and OUT2 at the confronting ends thereof, and the other ends are grounded. The first to third transmission lines 301 to 303 are formed on the surface of or in a dielectric substrate which is not shown in FIG. 16A.

The balun transformer of Patent Document 3 having the structure described above uses as the dielectric substrate including a multi-layer dielectric substrate formed by stacking a plurality of dielectric layers. The first to third transmission lines 301 to 303 are made of microstrip lines, strip lines or coplanar lines formed on the surface of or in a multi-layer substrate having a plurality of dielectric layers. The other ends of the first to third transmission lines 301 to 303 are grounded to an external ground via through conductors such as through hole conductors and via conductors formed in the dielectric substrate and/or terminal electrodes formed on the side walls of the dielectric substrate and made of metalized conductor layers, so-called casterllation conductors or the like. In this manner, the balun transformer which is compact and has excellent high frequency transmission characteristics can be formed on the surface of or in the dielectric substrate. This balun transformer can be formed integrally with a high frequency circuit and is suitable for the high frequency circuit.

In forming the balun transformer of the invention described in Patent Document 3, the dielectric substrate typically a multi-layer dielectric substrate formed by stacking a plurality of dielectric layers, the first to third transmission lines 301 to 303 made of microstrip lines, strip lines, coplanar lines or the like, the unbalanced terminal IN, the balanced terminals OUT1 and OUT2, through conductors, terminal electrodes can be formed by using various materials and types used in well-known high frequency wiring substrates.

The following description is given in Patent Document 4: Japanese Patent Application Publication No. 2002-33216 (paragraphs 0008 to 0010) titled "Stacked Balun Transformer".

An object of the invention of Patent Document 4 is to provide a stacked balun transformer having good coupling in a broadband, particularly at a high frequency of 1 GHz or higher.

The stacked balun transformer of Patent Document 4 is a stacked balun transformer having at least two pairs of λ/4 strip lines electromagnetically coupled, and is characterized in that a non-magnetic layer containing polyvinyl benzyl ether compound is disposed between paired strip lines electromagnetically coupled, and that a magnetic layer made of polyvinyl benzyl ether compound dispersed with magnetic powders is disposed above and under a composite layer constituted of the paired strip lines and the non-magnetic layer.

Since the non-magnetic layer containing polyvinyl benzyl ether compound is disposed between paired strip lines, capacitive components between the strip lines can be reduced because the polyvinyl benzyl ether compound has a low relative dielectric constant of about 2.5 to 3.5. Furthermore, the number of crossed fluxes between strip lines can be increased because of non-magnetism so that a coupling coefficient increases. Polyvinyl benzyl ether compound can be manufactured easily by the epoxy resin manufacturing process. There is no problem of cracks and warps as in the case of baking ceramic.

The following description is given in Patent Document 5: Japanese Patent Application Publication No. 2005-306696 (paragraphs 0008 and 0009) titled "Magnetic Ferrite, Common Mode Noise Filter Using Magnetic Ferrite, and Chip Transformer".

The invention of Patent Document 5 uses magnetic ferrite having the main components of Fe, Co and Zn having compositions in the range of 39.5:53.0:7.5 mol %, 39.5:48.0:12.5 mol %, 20.0:67.5:12.5 mol %, and 20.0:55.0:25.0 added with copper oxide of 8 to 14 wt %.

The magnetic ferrite, a common mode noise filter and a chip transformer using the magnetic ferrite can realize magnetic ferrite which has a low loss in a high frequency band and can be baked together with silver electrodes, and can realize a high frequency common mode noise filter and chip transformer having a large coupling coefficient between two coils, by using the magnetic ferrite in stacked electronic components.

SUMMARY OF THE INVENTION

A compact high frequency apparatus such as a portable phone requires a compact balun transformer. The electrical characteristics of a balun transformer require amplitude balance characteristics, phase balance characteristics and the like. In order to satisfy the desired electrical characteristics, electromagnetic coupling between coils of a balun transformer having a plurality of stacked coils is required to have a proper coupling force. The electromagnetic coupling between stacked coils is influenced by a width, thickness and length of conductor constituting each coil, a thickness, relative dielectric constant and tangent dielectric constant of each dielectric layer between stacked coils, a layout of ground conductors, and the like.

The circuit shown in FIG. 16A is generally used for an existing balun transformer. The unbalanced line having the unbalanced signal input terminal Port1 is wound as a coil, and the balanced line having the balanced signal input terminal Port2 and the balanced line having the balanced signal input terminal Port3 are wound as coils. A coupling coefficient between the unbalanced line coil and the balanced line coils is made large to perform balance-unbalance conversion. The unbalanced line is longer than the balanced line. The coupling coefficient is weakened more in the balanced line having the balanced input/output terminal Port3 than the balanced line having the balanced input/output terminal Port2. Since the balance level of the balun transformer is lowered, there arises a problem of degraded amplitude balance characteristics and phase balance characteristics.

Further, as shown in FIG. 15, in the structure of an existing balun transformer having two divided unbalanced lines, it can be assumed that there are two resonators or transformers between the unbalanced and balanced lines. The balun transformer characteristics are obtained by magnetically coupling each of the two divided unbalanced lines and balanced lines. The unbalanced line is made of one line of serially connected coils and the two resonators or transformers are connected at physically spaced positions. Therefore, when an unbalanced signal is input to the unbalanced signal input terminal Port1, balanced signal outputs at the balanced input/output terminals Port2 and Port3 have an electrical phase difference, posing a problem of difficulty of a broadband.

The present invention is made in view of settling the above-described issue. According to one aspect of the present invention, there are provided a compact broadband balun transformer, a balun transformer mounting structure and an electronic apparatus having a built-in mounting structure.

Namely, the present invention relates to a balun transformer in which: first to fourth layer coils are stacked and coupled magnetically; one end of each coil of the first to fourth layer coils is grounded; the second and third layer coils are connected in parallel, an unbalanced signal is input/output to/from a common terminal of the second and third layer coils; a first balanced signal is input/output to/from the other end of the first layer coil; and a second balanced signal is input/output to/from the other end of the fourth layer coil.

The present invention also relates to a balun transformer mounting structure in which the balun transformer is mounted on a mounting substrate, and the one end of each coil of the balun transformer is connected to a ground wiring formed on the mounting substrate.

The present invention also relates to an electronic apparatus having the balun transformer mounting structure.

These and other features and aspects of the invention are set forth in detail below with reference to the accompanying drawings in the following detailed description of the embodiments.

BRIEF DESCRIPTION OF THE DRAWINGS

FIGS. 1A and 1B are diagrams showing an example of a balun transformer according to an embodiment of the present invention, in which FIG. 1A shows an equivalent circuit, and FIG. 1B is a perspective view showing an example of the structure of the balun transformer.

FIGS. 4A and 4B are cross sectional views showing an example of the structure and mounting structure of the balun transformer, in which FIG. 4A is an xz cross sectional view and FIG. 4B is a yz cross sectional view.

FIGS. 5A and 5B are diagrams showing an example of the structure of the balun transformer, in which FIG. 5A is a perspective view showing the layout of each layer, and FIG. 5B is a perspective view showing an example of the layout of coils of the balun transformer.

FIG. 8B is a yz cross sectional view.

FIGS. 10A and 10B are graphs showing the characteristics of the balun transformer, in which FIG. 10A shows phases of balanced outputs, and FIG. 10B shows the pass characteristics.

FIGS. 11A1 to 11B4 are diagrams illustrating calculation conditions for the balun transformer characteristics.

FIGS. 12A and 12B are diagrams showing the structure of a balun transformer according to a modification of the embodiment, in which FIG. 12A shows an equivalent circuit, and FIG. 12B is a perspective view showing an example of the structure of the balun transformer.

DESCRIPTION OF THE EMBODIMENTS

Figure 1A:
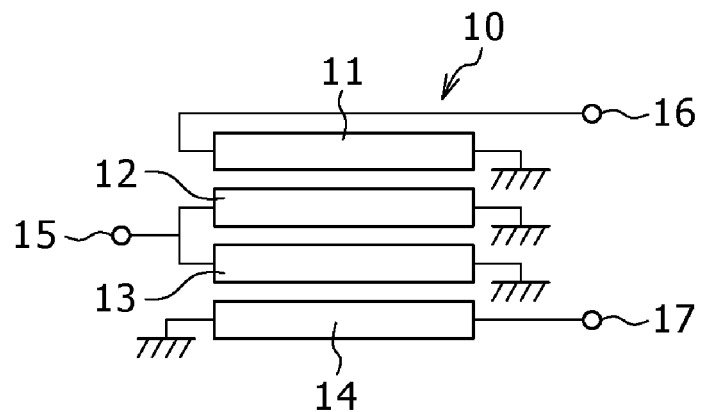

In a balun transformer according to an embodiment of the present invention, it is preferable that first to third layer coils are wound in the same direction, and a fourth layer coil is wound in an opposite direction to the same direction. The first to third layer coils are wound in the same direction, the second and third layer coils are connected in parallel, with an unbalanced signal being input/output to/from a common terminal, and the fourth layer coil is wound in the opposite direction to the above-described same direction. Accordingly, magnetic fields generated by the second and third layer coils are enhanced so that electromagnetic coupling between the first and fourth layer coils becomes strong. Therefore, as an unbalanced signal is input to the common terminal, a first balanced signal output from the other end of the first layer coil and a second balanced signal output from the other end of the fourth layer coil have high output levels.

The winding direction of the first layer coil is opposite to the winding direction of the fourth layer coil. Currents in opposite directions flow in the first and fourth layer coils, respectively. There is a cancelling relation between the magnetic fields generated by the first and fourth layer coils. However, this cancelling relation between the magnetic fields generated by the first and fourth layer coils has less magnetic influence, because the second and third layer coils are disposed between the first and fourth layer coils so that the first and fourth layer coils have a spaced physical distance. It is therefore possible to realize a balun transformed having good amplitude balance characteristics and phase balance characteristics as the electrical characteristics.

It is preferable that one end of each coil, which is grounded, is an inner end, and the other end of each coil is an outer end. The inner end of each coil is used as the one end and grounded, and the outer end of each coil is used as the other end, the outer ends of the second and third layer coils connected in parallel are used as the common terminal to/from which an unbalanced signal is input/output. A first unbalanced signal is input/output to/from the outer end of the first layer coil, and a second unbalanced signal is input/output to/from the outer end of the fourth layer coil. It is therefore possible to mount the balun transformer by electrically connecting the inner and outer ends of each coil to the mounting substrate by shorter conductor, i.e., electrically connecting each coil to the mounting substrate by shorter conductor, and to reduce parasitic capacitance.

It is preferable that each coil is stacked via a dielectric layer or a magnetic layer, and the one end of each coil is electrically connected via a via hole provided to the dielectric layer or the magnetic layer. If each coil is stacked via the dielectric layer, the balun transformed can be made compact by forming the dielectric layer made of dielectric material having a large relative dielectric constant and a small tangent dielectric constant.

If each coil is stacked via the magnetic layer, leakage of a magnetic field from the inside of the balun transformer to the external can be reduced, and a magnetic field entering the inside of the balun transformer from the external can be suppressed, resulting in reduced magnetic noises.

Further, one end of each coil (inner end of each coil) is electrically connected via the via hole provided to the dielectric layer or magnetic layer. It is therefore possible to electrically connect the inner end of each coil to the mounting substrate by shorter conductor and to reduce parasitic capacitance.

It is preferable that a first magnetic layer is formed facing or contacting an outermost coil of each coil. Since the first magnetic layer is formed facing or contacting an outermost coil of each coil, leakage of a magnetic field from the inside of the balun transformer to the external can be reduced, and a magnetic field entering the inside of the balun transformer from the external can be suppressed, resulting in reduced magnetic noises.

It is preferable that a dielectric layer or a magnetic layer is interposed between the first magnetic layer and the outermost coil. If the dielectric layer is interposed, the balun transformed can be made compact by forming the dielectric layer made of dielectric material having a large relative dielectric constant and a small tangent dielectric constant.

If the magnetic layer is interposed, leakage of a magnetic field from the inside of the balun transformer to the external can be reduced, and a magnetic field entering the inside of the balun transformer from the external can be suppressed, resulting in reduced magnetic noises.

It is preferable that a second magnetic layer is formed facing or contacting an innermost coil of each coil. Since the second magnetic layer is formed facing or contacting an innermost coil of each coil, leakage of a magnetic field from the inside of the balun transformer to the external can be reduced, and a magnetic field entering the inside of the balun transformer from the external can be suppressed, resulting in reduced magnetic noises.

Therefore, if the balun transformer is mounted on the mounting substrate, it is possible to prevent a magnetic field from entering the mounting substrate from the balun transformer and the balun transformer from the mounting substrate, resulting in reduced magnetic noises.

It is preferable that at least a partial area of the second magnetic layer is formed separately, and a wiring of the innermost coil passes through the separated partial area. A wiring of the innermost coil, i.e., a conductive wiring connected to the inner end of the coil formed facing the mounting substrate on which the balun transformer is to be mounted, is connected to the ground wiring formed on the mounting substrate via the separated partial area. It is therefore possible to electrically connect the balun transformer to the mounting substrate by shorter conductor and to reduce stray capacitance.

It is preferable that a dielectric layer or a magnetic layer is interposed between the second magnetic layer and the innermost coil. If the dielectric layer is interposed, the balun transformed can be made compact by forming the dielectric layer made of dielectric material having a large relative dielectric constant and a small tangent dielectric constant.

If the magnetic layer is interposed, leakage of a magnetic field from the inside of the balun transformer to the external can be reduced, and a magnetic field can be suppressed from entering the inside of the balun transformer from the external, resulting in reduced magnetic noises.

It is preferable that first to fourth conductive layers are formed surrounding outer peripheries of the first to fourth layer coils, respectively, and the first to fourth conductive layers are grounded.

With this arrangement, the first to fourth layer coils can be shielded from external noises, and the balun transformer can be operated stably. The first to fourth conductive layers are electrically connected via the via hole provided to the dielectric layer or magnetic layer. Therefore, the conductive wirings connected to the via holes electrically connect the first to fourth conductive layers to the ground wiring formed on the mounting substrate on which the balun transformer is to be mounted. It is therefore possible to electrically connect the balun transformer to the mounting substrate by shorter conductor, resulting in reduced stray capacitance.

It is preferable that first and second coil sets each include the first to fourth layer coils, the first coil set stacks the first to fourth layer coils in this order in a first direction, the second coil set stacks the first to fourth layer coils in this order in a second direction opposite to the first direction, and the first layer coil of the first coil set is stacked facing the first layer coil of the second coil set.

Each coil of the first to fourth layer coils constituting the first and second coil sets is stacked in a small occupied area and magnetically coupled. It is therefore possible to structure a compact broadband balun transformer having two unbalanced input/output terminals and four balances input/output terminals in a small area and being capable of performing two types of balance-unbalance conversion in parallel at the same time.

It is preferable that in the balun transformer mounting structure, insulating resin is embedded between each coil of the balun transformer and the ground wiring. Since the insulating resin is embedded between each coil of the balun transformer and the ground wiring, it is possible to reduce parasitic capacitance and improve phase characteristics and pass characteristics of balanced outputs of the balun transformer.

Embodiments of the present invention will be described in detail with reference to the accompanying drawings.

A balun transformer according to an embodiment of the present invention is a stacked type balun transformer constituted of a plurality of stacked coils (hereinafter simply called a "balun transformer"). First to fourth coils are stacked and coupled magnetically. One end of each coil of the first to fourth coils is grounded. The second and third layer coils are connected in parallel, and an unbalanced signal is input/output to/from a common terminal (first terminal) of the second and third layer coils. A first balanced signal is input/output to/from the other end (second terminal) of the first layer coil, and a second balanced signal is input/output to/from the other end (third terminal) of the fourth layer coil. The first to third coils are wound in the same direction, and the fourth coil is wound in the opposite direction to the above-described same direction. Outer peripheries of the first to fourth coils are surrounded by first to fourth grounded conductive layers, to shield the coils from an external electromagnetic field. One end of each of the first to fourth coils is connected to a ground wiring provided to the mounting substrate, and the balun transformer is mounted on the mounting substrate.

The balun transformer according to the embodiment of the present invention has the structure described hereunder.

The balun transformer has a multi-layer substrate structure having four layers or more formed by thin film processes using a semiconductor or ceramic. A coil is formed in each of the four layers of the substrate. First to fourth coils are formed in first to fourth wiring layers, respectively. The first to third coils are wound in the same direction, and the fourth coil is wound in the opposite direction to the winding direction of the first to third coils. Each coil is electrically connected via a via hole at a center end (inner end) of each of the first to fourth coils. Each coil is electrically connected to GND.

The first and fourth coils are used as balanced input/output coils, the second and third coils are used as unbalanced input/output coils, and the second and third coils are connected electrically in parallel. Since magnetic fields generated by the second and third coils are enhanced, coupling between the balanced input/output first and fourth coils becomes strong and the input/output level increases. Although the first and fourth coils are wound to cancel out the currents, the first and fourth coils have a spaced physical distance because the second and third coils are disposed between the first and fourth coils. Therefore, the balun transformer has less magnetic influence of the first and fourth coils.

In the structure described above, when the balun transformer in the form of the multi-layer substrate is mounted on a module, a structure is used in which a mother mounting substrate or the like, a conductive wiring for GND connection is formed on the module, mother mounting substrate or the like, and the balun transformer is electrically connected to GND via a copper post, bump or the like. Molding resin (insulating resin) is embedded between the balun transformer and the module, mother mounting substrate or the like, and the balun transformer is electrically connected to GND via the copper post or bump. The conductive wiring of the module, mother mounting substrate or the like and the fourth coil of the balun transformer are physically spaced by about 80 μm to 150 μm. It is therefore possible to reduce parasitic capacitance and improve the balun transformer characteristics.

Further, a magnetic material, i.e., ferrite is disposed on the first coil side. A region between the first coil and ferrite may be a void space or a space filled with insulating resin. Ferrite is disposed also on the fourth coil side. In order to realize the structure to be described later in (2), the ferrite is divided into two parts or formed with a recessed area, so that the conductive line of the balun transformer in the form of the multi-layer substrate does not interfere the conductive wiring on the module, mother mounting substrate or the like. In the balun transformer structure, a thickness of the ferrite is suppressed to about 50 μm to 100 μm to be mounted on the module or the like.

According to the present invention, it is possible to provide a compact broadband balun transformer, a balun transformer mounting structure and an electronic apparatus having a built-in mounting structure. The balun transformer can be used as a balance-unbalance signal converter for converting balanced signals into an unbalanced signal or vice versa, a phase converter and the like. For example, the balun transformer can be used effectively by mounting it as the balance-unbalance signal converter on a mobile communication apparatus such as a portable phone.

Figure 1B:
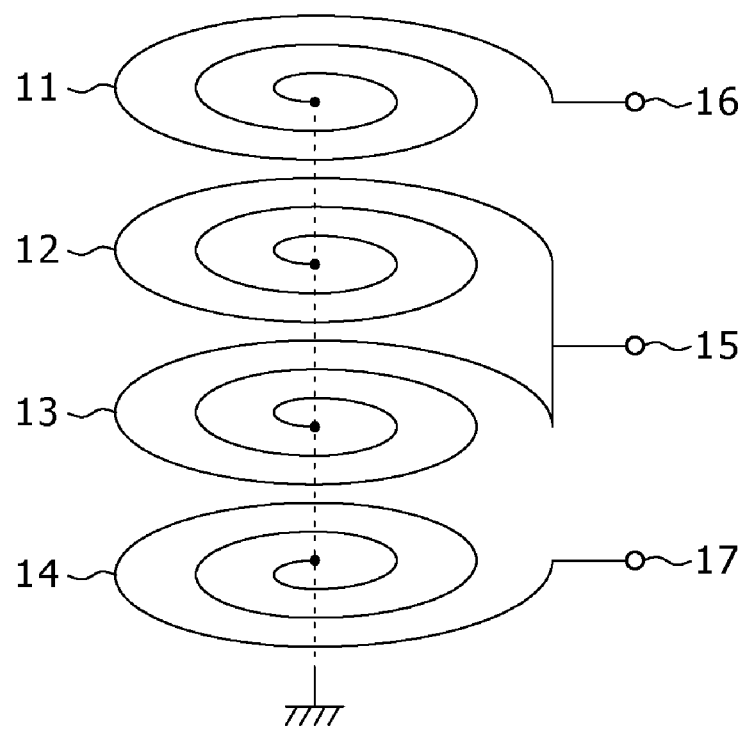

FIGS. 1A and 1B are diagrams showing an example of the structure of a balun transformer according to an embodiment of the present invention. FIG. 1A shows an equivalent circuit, and FIG. 1B is a schematic perspective view showing an example of the structure of coils of a balun transformer.

A balun transformer 10 of the embodiment is shown by the equivalent circuit shown in FIG. 1A. The balun transformer 10 is constituted of a first coil (first balanced coil) 11, a second coil (first unbalanced coil) 12, a third coil (second unbalanced coil) 13, a fourth coil (second balanced coil) 14.

One end (an inner end of a coil) of each of the first to fourth coils 11 to 14 is connected to a ground (GND).

Each of the first to third coils 11 to 13 is wound in the same direction, and the fourth coil 14 is wound in an opposite direction to the above-described same direction. A width, thickness and pitch and the number of turns of conductor constituting each of the first to fourth coils 11 to 14 are the same.

The second and third coils 12 and 13 are connected electrically in parallel, the other ends (outer ends of coils) of the second and third coils 12 and 13 are electrically connected to a common terminal (a first terminal (an unbalanced signal input/output terminal) 15). An unbalanced signal is input/output relative to the first terminal 15.

The other terminal (outer terminal of a coil) of the first coil 11 is electrically connected to a second terminal (first balanced signal input/output terminal) 16, and a first balanced signal is input/output to/from the second terminal 16. The other terminal (outer terminal of a coil) of the fourth coil 14 is electrically connected to a third terminal (second balanced signal input/output terminal) 17, and a second balanced signal is input/output to/from the third terminal.

Outer peripheries of the first to fourth coils 11 to 14 are surrounded by first to fourth conductive layers grounded (not shown in FIGS. 1A and 1B).

In the example of the structure of the balun transformer shown in FIG. 1B, each of the first to third coils 11 to 13 is wound clockwise direction, and the fourth coil 14 is wound counterclockwise. The internal end of each of the first to fourth coils 11 to 14 is commonly connected to the ground (GND).

As an unbalanced signal is input to the first terminal 15 of the balun transformer, a first balanced signal is output to the second terminal 16 and a second balanced signal is output to the third terminal 17. Since the second and third coils 12 and 13 are connected electrically in parallel, the first and second balanced signals have a phase difference to 180°.

As shown in FIG. 1B, the balun transformer of the embodiment is constituted of two transformers: a first transformer coil constituted of the first unbalanced coil 12 and first balanced coil 11; and a second transformer coil constituted of the second unbalanced coil 13 and second balanced coil 14. An unbalanced signal is input to the first and second transformer coils in parallel. In this case, a signal level of the unbalanced signal transmitted to each of the first and second transformer coils reduced to a half. According to a balun transformer of the related art, an unbalanced signal is input serially to two transformer coils. Therefore, a loss is doubled as compared to the balun transformer of the embodiment. First and second balanced output lines are electrically connected to the first and second transformer coils in a state that an electrical phase is inverted by 180°. Therefore, an output phase difference is 180° between the first and second balanced outputs.

As the first balanced signal is input to the second terminal 16 and the second balanced signal is input to the third terminal 17, an unbalanced signal is output from the first terminal 15.

A balun transformer is used being mounted on various electronic apparatus. A balun transformer is electrically connected to and mounted on a mother mounting substrate (or mounting substrate) constituting an electronic apparatus. First to third signal terminals are provided to signal wirings of the mother mounting substrate, the first to third signal terminals are electrically connected via conductive wires to the first to third terminals 15 to 17. The inner end of each of the first to fourth coils 11 to 14 is electrically connected via a conductive wiring to a ground wiring provided to the mother mounting substrate, and to the common ground (GND). A balun transformer is mounted on the mounting substrate which in turn is mounted on various electronic apparatus.

Figure 2:
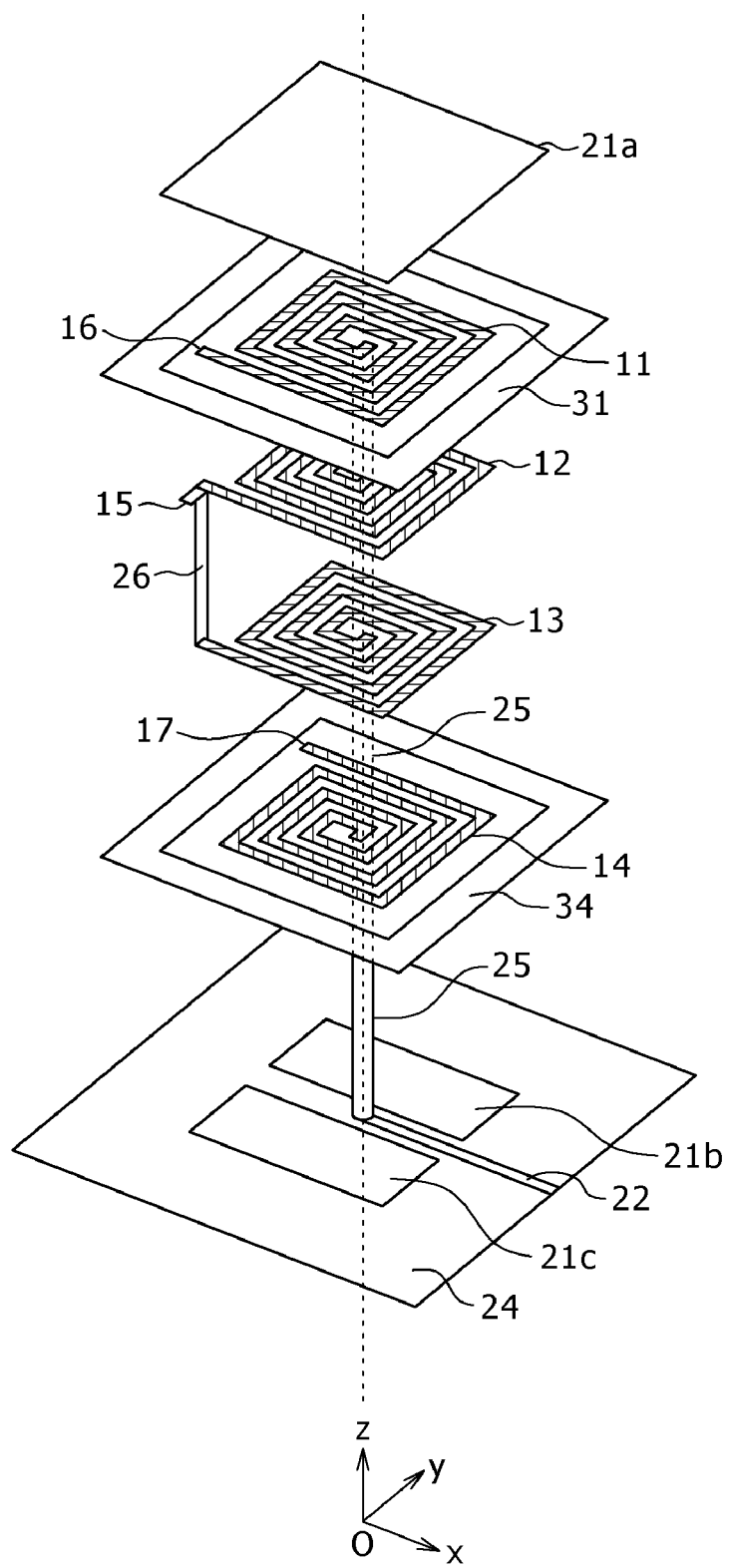
FIG. 2 is a perspective view showing the layer structure of the balun transformer and an example of the layout of each layer.

FIG. 2 is a perspective view showing an example of the stacked layout of each layer of a balun transformer according to the embodiment of the present invention.

Figure 3:
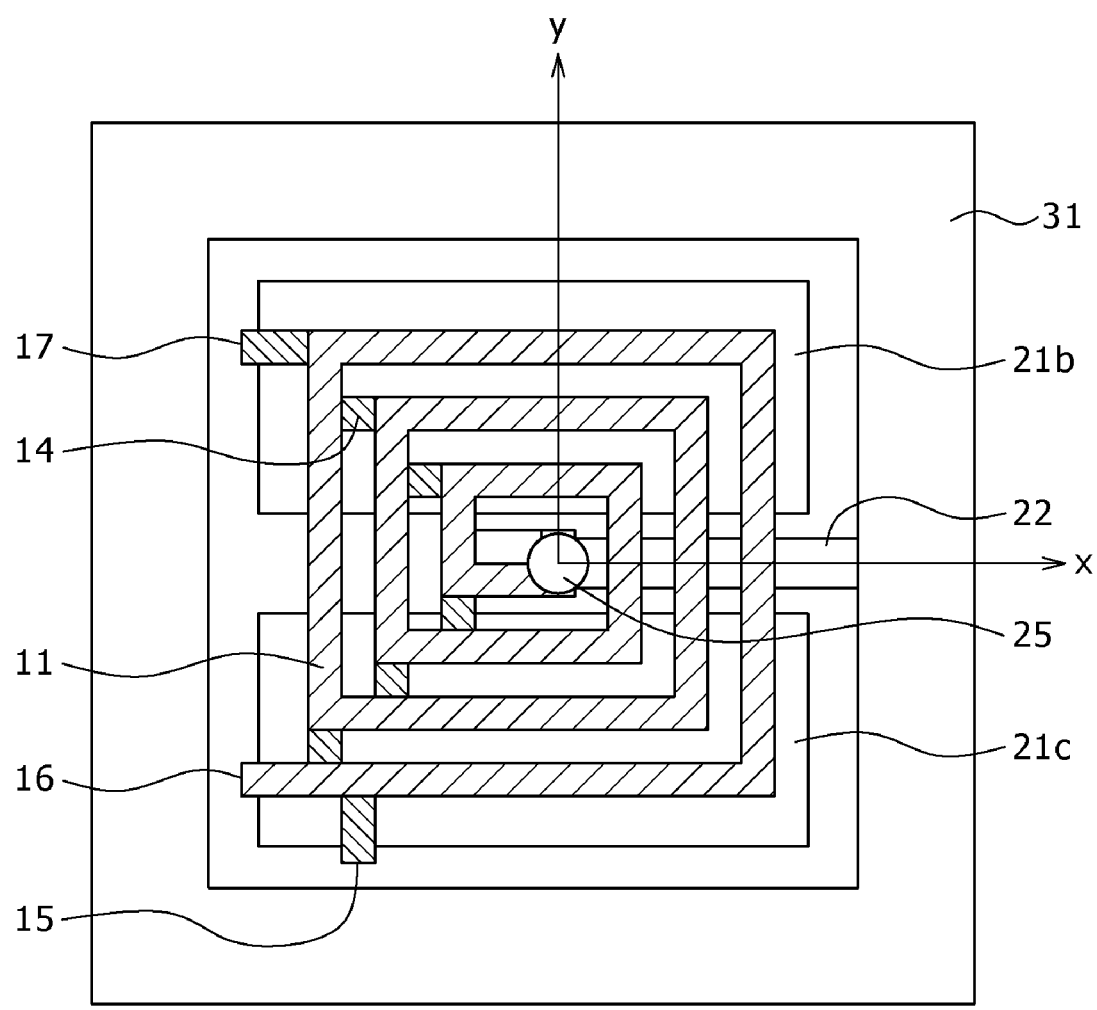
FIG. 3 is a plan view showing an example of the structure of the balun transformer.

FIG. 3 is a plan view illustrating an example of the balun transformer according to the embodiment of the present invention. FIG. 3 is a plan view showing the layout of each layer shown in FIG. 2. In order to simplify the drawing of FIG. 3, a ferrite 21*a* and a mother mounting substrate 24 shown in FIG. 2 are omitted.

As shown in FIG. 2, in the balun transformer of the embodiment, the ferrite 21*a*, the first coil 11 and GND 31, the second coil 12 and GND 32 (not shown in FIG. 2), the third coil 13 and GND 33 (shown in FIG. 4), the fourth coil 14 and GND 34, ferrites 21*b* and 21*c* and a substrate wiring 22, are sequentially stacked from the upper layer toward the lower layer along a z-direction. GND's 31, 32, 33 and 34 represent ground electrode layers.

As shown in FIG. 2, each of the first to third coils 11 to 13 is wound in the same direction (clockwise direction), and the fourth coil 14 is wound in the opposite direction (counterclockwise direction) to the above-described same direction. A width, thickness and pitch and the number of turns of conductor constituting each coil are the same.

The outer ends of the second and third coils 12 and 13 are electrically connected together by a common wiring 26, and to the first terminal 15 which is a common terminal. The outer end of the first coil 11 is electrically connected to the second terminal 16, and the outer end of the fourth coil 14 is electrically connected to the third terminal 17. The first to third terminals 15 to 17 are electrically connected to substrate wiring terminals for signal input/output formed on a mother mounting substrate 24, via through conductors extending through partial regions of the balun transformer and formed by copper post, via or the like not shown in FIG. 2. The second terminal 16 is disposed along a negative direction of a y-axis, and the third terminal 17 is disposed along a positive direction of the y-axis.

The inner end of each of the first to fourth coils 11 to 14 is electrically connected together by a copper post 25, via or the like, and electrically connected and grounded to the substrate wiring 22 formed on the mother mounting substrate 24.

As shown in FIGS. 2 and 3, outer peripheries of the first to fourth coils 11 to 14 are surrounded by GND 31, GND 32 (not shown in FIG. 2), GND 33 (not shown in FIG. 2) and GND 34, respectively. GND's 31 to 34 as the ground electrode layer are electrically connected to copper post, via or the like not shown in FIG. 2, and electrically connected and grounded to the substrate wiring 22 formed on the mother mounting substrate 24.

The ferrite 21*a* is stacked upon the first coil 11 directly or via insulating resin 27*a* (not shown in FIG. 2). A layer of insulating resin 27*a* (not shown in FIG. 2) is formed between the first and second coils 11 and 12, between the second and third coils 12 and 13, and between the third and fourth coils 13 and 14.

As shown in FIGS. 2 and 3, a ferrite layer is formed being separated at least partially so as to pass the substrate wiring 22 formed on the mother mounting substrate 24. For example, a ferrite layer of a recessed shape passing the substrate wiring is formed, or ferrite layers 21*b* and 21*c* are formed on the surface of the mother mounting substrate 24, with the substrate wiring 22 being interposed therebetween along the x-axis.

A layer of insulating resin 27*b* (not shown in FIG. 2) is formed between the mother mounting substrate 24 and the fourth coil 14. The ferrite layers 21*b* and 21*c* and the substrate wiring 22 may be formed part of the layer of insulating resin 27*b* (not shown in FIG. 2).

Figure 4A:
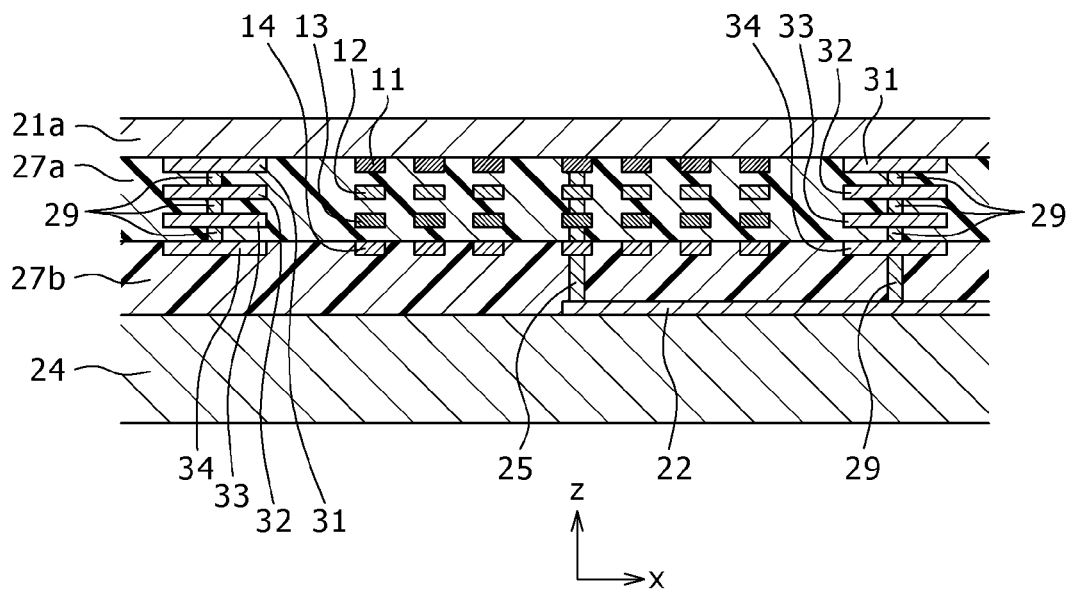
Figure 4B:
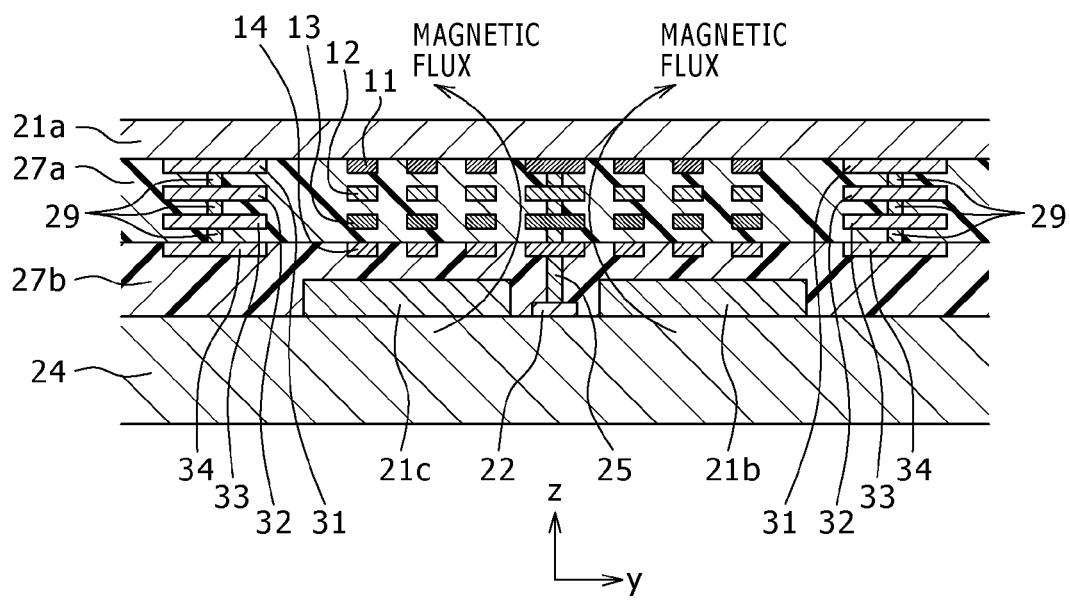

FIGS. 4A and 4B are cross sectional views showing an example of the structure of the balun transformer and an example of the mounting structure of the balun transformer according to the embodiment of the present invention. FIG. 4A is an xz cross sectional view and FIG. 4B is a yz cross sectional view.

As shown in FIGS. 4A and 4B, the ferrite 21*a*, first coil 11, insulating resin 27*a*, second coil 12, insulating resin 27*a*, third coil 13, insulating resin 27*a*, fourth coil 14, insulating resin 27*b*, ferrites 21*b* and 21*c* and substrate wiring 22 are sequentially stacked on the mother mounting substrate 24 from the upper layer toward the lower layer.

The inner end of each of the first to fourth coils 11 to 14 is electrically connected to the copper post 25, and electrically connected and grounded to the substrate winding 22 formed on the mother mounting substrate 24.

GND's 31 to 34 formed on the outer peripheries of the first to fourth coils 11 to 14 are electrically connected to the copper post 29, and electrically connected and grounded to the substrate winding 22 formed on the mother mounting substrate 24.

The input/output terminals shown in FIGS. 2 and 3 (the first terminal 15 electrically connecting the outer ends of the second and third coils 12 and 13, the second terminal 16 electrically connecting the outer end of the first coil 11, and the third terminal 17 electrically connecting the outer end of the fourth coil 14) are electrically connected to the substrate wiring terminals for signal input/output formed on the mother mounting substrate 24, via through conductors extending through partial regions of the balun transformer and formed by copper post, via or the like not shown in FIGS. 4A and 4B.

As described with reference to FIGS. 1 to 4B, the plurality of stacked coils constituting the balun transformer of the embodiment are stacked in the order of the first balanced coil (first coil) 11, first unbalanced coil (second coil) 12, second unbalanced coil (third coil) 13 and second balanced coil (fourth coil) 14, from the upper layer toward the lower layer.

The first balanced coil (first coil) 11, first unbalanced coil (second coil) 12, second unbalanced coil (third coil) 13 and second balanced coil (fourth coil) 14 can be formed by thin film technologies of semiconductor processes such as thin film formation, lithography, and chemical mechanical polishing (CMP). Spaces between the coils constituting the balun transformer are filled with organic material insulator (insulating resin 27a) of polyimide resin or the like. A relative dielectric constant of the insulator is about 2 to 4 (at 1 MHz to 10 GHz).

The first to fourth coils 11 to 14 are electrically connected together at the center of each coil or at a position offset from the center. The magnetic member (ferrite) 21a having a area broader than that of the first coil and a thickness of 50 μm to 100 μm is disposed on the uppermost first coil 11, directly or via an insulating layer (insulating resin) having a thickness of several μm to several tens μm The copper post 25, bump or the like having a height of 0 μm to 180 μm electrically connects lands formed in central areas (inner ends of each coil) of the first to fourth coils 11 to 14. A land formed at the inner end of the lowermost fourth coil 14 is electrically connected to the line pattern (substrate wiring 22) formed on the mother mounting substrate 24 mounting the balun transformer by the copper post 25, bump or the like.

In this manner, the center (inner end of each coil) of each of the first to fourth coils 11 to 14 is electrically connected to the substrate wiring 22 formed on the mother mounting substrate 24. The inner ends of the coils are electrically connected to the reference GND by the substrate wiring 22 of the mother mounting substrate 24.

Similarly, the outer ends of the first to fourth coils 11 to 14 are electrically connected to the line patterns formed on the mother mounting substrate 24, similar to the inner ends of the coils.

A space between the lowermost fourth coil 14 and mother mounting substrate 24 is filled with the molding resin (insulating resin 27b). Further, two magnetic members (ferrites) 21b and 21c are disposed between the lowermost fourth coil 14 and the mother mounting substrate 24. As shown in FIGS. 2 to 4B, the two ferrites 21b and 21c are separately disposed sandwiching the substrate wiring 22 so as not to interfere the substrate wiring of the mother mounting substrate 24. A thickness of each of the ferrites 21b and 21c is set to 50 μm to 100 μm. A ferrite having a recessed shape may be used to dispose the substrate wiring 22 in the recessed area so as not to interfere the substrate wiring 22 of the mother mounting substrate 24.

The material and size of each layer constituting the balun transformer of the embodiment will be described illustratively.

A conductor wire of each of the first to fourth coils 11 to 14 has a layer thickness of 15 μm, a width of 20 μm, a pitch of 20 μm and a line/space of 20 μm/20 μm. A relative dielectric constant of the insulating resin 27a is 3.0 and a tangent dielectric constant of 0.02 (at 1 MHz to 10 GHz). The land formed at the inner end of the lowermost fourth coil 14 and the copper post 25 formed on the mother mounting substrate 24 and electrically connecting the substrate wiring 22 have a height of 120 μm.

The insulating resin 27b (molding resin) filling between the lowermost fourth coil 14 and mother molding substrate 24 has a thickness of 120 μm, a relative dielectric constant of 4.0 and a tangent dielectric constant of 0.05 (at 1 MHz to 10 GHz). The mother mounting substrate 24 is made of a glass epoxy substrate FR4, and the substrate wiring 22 has a width of 100 μm. A thickness of the magnetic member (ferrites 27a and 27b) is 50 μm to 100 μm.

Next, description will be made on advantages of the balun transformer of the embodiment.

An unbalanced signal from the first terminal (unbalanced signal input/output terminal) shown in FIGS. 1 to 3 is input parallelly to the second coil (first unbalanced coil) 12 and the third coil (second unbalanced coil) 13. As shown in FIGS. 1 to 3, the second and third coils 12 and 13 wound in the same direction as that of the first coil 11 are disposed between the uppermost first coil (first balanced coil) 11 and the lowermost fourth coil (second balanced coil) 14, and the outer ends of the second and third coils are electrically connected via a via hole or the like and to the first terminal 15. Since the second and third coils 12 and 13 are wound in the same direction, a magnetic flux density increases as shown in FIG. 4B. The first balanced coil (first coil) 11 is disposed as the uppermost layer, and the second balanced coil (fourth coil) 14 is disposed as the lowermost layer.

The first balanced coil 11 is wound in the same direction as that of the first and second unbalanced coils 12 and 13, and the second balanced coil 14 is wound in the opposite direction to the above-described same direction. The ends (inner ends) in the central areas of the first to fourth coils 11 to 14 are electrically connected together via a via hole, and electrically connected to the substrate wiring 22 of the mother mounting substrate 24 via the copper post 25, bump or the like and to the reference GND.

With the structure described above, the following advantages are presented.

(1) Since the first and second unbalanced coils disposed between the first and second balanced coils increase the magnetic flux density, a coupling coefficient of the first balanced coil and second unbalanced coil is increases and a loss is reduced. Similarly, a coupling coefficient of the second balanced coil and first unbalanced coil is increases and a loss is reduced. With these effects, the level and phase difference of the balun transformer can be maintained and a balanced output level can be improved. Namely, as an unbalanced signal is input to the unbalanced signal input/output terminal, the amplitude and phase difference can be made substantially the same for both a first signal output from the first balanced signal input/output terminal and a second signal output from the second balanced signal input/output terminal.

(2) Since the first and second balanced coils are wound in opposite directions, although magnetic fluxes are cancelled out, coupling between the two balanced coils can be suppressed by setting the first and second balanced coils spaced apart from each other.

(3) The inner end of each coil constituting the balun transformer is electrically connected to the reference GND by the substrate wiring formed on the mother mounting substrate at a distance of 30 μm to 180 μm via the copper post, bump or the like. Therefore, it is possible to suppress parasitic capacitance between the substrate wiring of the mother mounting substrate and each coil constituting the balun transformer.

(4) The band can be shifted to the low frequency side by inserting the magnetic member between the mother mounting substrate and each layer constituting the balun transformer.

With the effects described above, a broadband balun transformer can be realized.

In the structure of the balun transformer described above, as shown in FIGS. 4A and 4B, the ferrite 21a, first coil 11, insulating resin 27a, second coil 12, insulating resin 27a, third coil 13, insulating resin 27a, fourth coil 14, insulating resin 27b, ferrites 21b and 21c and substrate wiring 22 are sequentially stacked from the upper layer toward the lower layer. In the structure described above, therefore, the ferrite 21a is stacked adjacent to the first coil 11, and the ferrites 21b and 21c are stacked upon the fourth coil 14 via the insulating resin 27b. The ferrites 21b and 21c and substrate wiring 22 are formed as part of the balun transformer.

The ferrites 21b and 21c may be formed as part of the balun transformer, or may be formed on the side of the mother molding substrate 24. The substrate wiring 22 is a wiring for electrically connecting the conductive wiring from the end of each coil constituting the balun transformer and the conductive lines formed on the mother molding substrate 24, and may be formed as part of the balun transformer or may be formed on the side of the mother molding substrate 24.

Next, description will be made on the structure in which ferrite is stacked on the first coil via the insulating resin, and ferrite is stacked in contact with the fourth coil.

FIGS. 5A and 5B are diagrams showing an example of the structure of a balun transformer according to an embodiment of the present invention. FIG. 5A is a perspective view showing the layout of each layer, and FIG. 5B is a perspective view showing the layout of coils of the balun transformer.

As shown in FIG. 5A, the balun transformer of the embodiment is constituted of a first coil (first balanced coil) 11a, a second coil (first unbalanced coil) 12a, a third coil (second unbalanced coil) 13a and a fourth coil (second balanced coil) 14a, stacked in the x-direction to electromagnetically couple each coil.

One end (inner end of a coil) of each of the first to fourth coils 11a to 14a is connected to ground (GND). The first to third coils 11a to 13a are wound in the same direction, and the fourth coil 14a is wound in the opposite direction to the above-described same direction.

The second and third coils 12a and 13a are electrically connected parallel, and the other ends (outer ends of coils) of the second coil 12a and 13a are electrically connected to a first terminal (unbalanced signal input/output terminal) 15a by a common wiring 26a. An unbalanced signal is input/output relative to the first terminal 15a as a common terminal.

The other end (outer end of a coil) of the first coil 11a is electrically connected to a second terminal (first balanced signal input/output terminal) 16a. A first balanced signal is input/output to/from the second terminal 16a. The other end (outer end of a coil) of the fourth coil 14a is electrically connected to a third terminal (second balanced signal input/output terminal) 17a. A second balanced signal is input/output to/from the third terminal 17a.

Outer peripheries of the first to fourth coils 11a to 14a are surrounded by first to fourth conductive layers 31a to 34a, respectively, which layers are GND's formed in the same layers as those of the coils.

As shown in FIG. 5B, the second terminal (first balanced signal input/output terminal) 16a is formed along the negative direction of the y-axis, and the third terminal (second balanced signal input/output terminal) 17a is formed along the positive direction of the y-axis. Therefore, stray capacitance will not be generated between the second and third terminals 16a and 17a.

In the example of the structure of the balun transformer shown in FIGS. 5A and 5B, the first to third coils 11a to 13a are wound clockwise, and the fourth coil 14a is wound counterclockwise. The inner ends of the first to fourth coils 11a to 14a are commonly connected to ground (GND).

When an unbalanced signal is input to the first terminal 15a of the balun transformer, a first balanced signal is output to the second terminal 16a and a second balanced signal is output to the third terminal 17a. Since the second and third coils 12a and 13a are connected electrically parallel, the first and second balanced signals have a phase difference to 180°.

The balun transformer of the embodiment is constituted of two transformers: a first transformer coil formed of the first unbalanced coil 12a and first balanced coil 11a; and a second transformer coil formed of the second unbalanced coil 13a and second balanced coil 14a. An unbalanced signal is input parallel to the first and second transformer coils. As a first balanced signal is input to the second terminal 16a and a second balanced signal is input to the third terminal 17a, an unbalanced signal is output to the first terminal 15a.

A balun transformer is electrically connected to and mounted on the mother mounting substrate (or mounting substrate) 24a constituting various electronic apparatus. First to third signal terminals are provided to signal wirings of the mother mounting substrate, and the first to third signal terminals are electrically connected via conductive wires to the first to third terminals 15a to 17a. The inner end of each of the first to fourth coils 11a to 14a is electrically connected via a conductive wiring (substrate wiring 22a) to a ground wiring provided to the mother mounting substrate, and to the common ground (GND). A balun transformer is mounted on the mounting substrate which in turn is mounted on various electronic apparatus.

As shown in FIGS. 5A and 5B, the balun transformer of the embodiment has the ferrite 21d, first coil 11a and GND 31a, second coil 12a and GND 32a, third coil 13a and GND 33a, fourth coil 14a and GND 34a, and ferrites 21e and 21f and substrate wiring 222, sequentially stacked in this order along the z-direction from the upper layer toward the lower layer. GND's 31a, 32a, 33a and 34a represent the ground electrode layers.

The outer ends of the second and third coils 12a and 13a are electrically connected by the common wiring 26a, and electrically connected to the first terminal 15a serves as the common terminal. The outer end of the first coil 11a is electrically connected to the second terminal 16a, and the outer end of the fourth coil 14a is electrically connected to the third terminal 17a. The first to third terminals 15a to 17a are electrically connected to the substrate wiring terminals for signal input/output formed on the mother mounting substrate 24a, via through conductors extending through partial regions of the balun transformer and formed by copper post, via or the like not shown in FIGS. 5A and 5B. The second and third terminals 16a and 17a are disposed along the positive and negative directions of the y-axis, respectively.

The inner ends of first to fourth coils 11a to 14a are electrically connected to a copper post 25a, a via or the like, and electrically connected and grounded to the substrate wiring 22a formed on the mother mounting substrate 24a. The ground electrode layers GND's 31a to 34a are electrically connected to a copper post, a via or the like not shown in FIGS. 5A and 5B, and electrically connected and grounded to the substrate wiring 22a formed on the mother mounting substrate 24a.

The ferrite 21d is stacked upon the first coil 11a via insulating resin 27d (not shown in FIGS. 5A and 5B) 27d. An insulating resin layer 27a (not shown in FIGS. 5A and 5B) is formed between the first and second coils 11a and 12a, between the second and third coils 12a and 13a and between the third and fourth coils 13a and 14a.

As shown in FIG. 5A, a ferrite layer is formed being separated at least partially so as to pass the substrate wiring 22a formed on the mother mounting substrate 24a. For example, a ferrite layer of a recessed shape passing the substrate wiring is formed, or ferrite layers 21e and 21f are formed adjacent to the fourth coil 14a, with the copper post 25a being interposed therebetween along the x-axis.

An insulating resin layer (not shown in FIGS. 5A and 5B) 27b is formed between the mother mounting substrate 24a and the fourth coil 14a. The ferrite layers 21e and 21f and the substrate wiring 22a may be formed in a partial layer of the insulating resin layer 27b (not shown in FIGS. 5A and 5B).

Figure 6A:
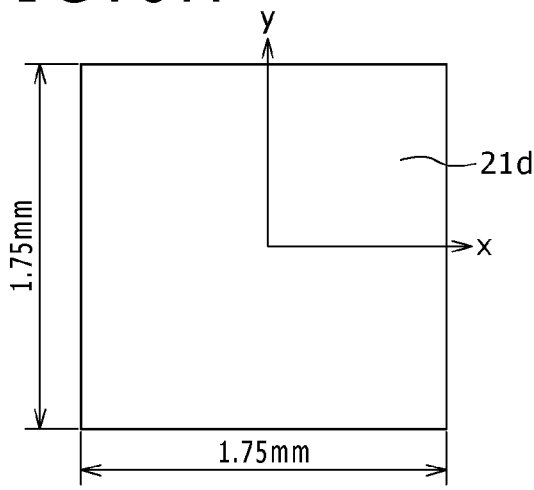
FIGS. 6A to 6C are diagrams showing each layer illustrating an example of the structure of the balun transformer.
Figure 6B:
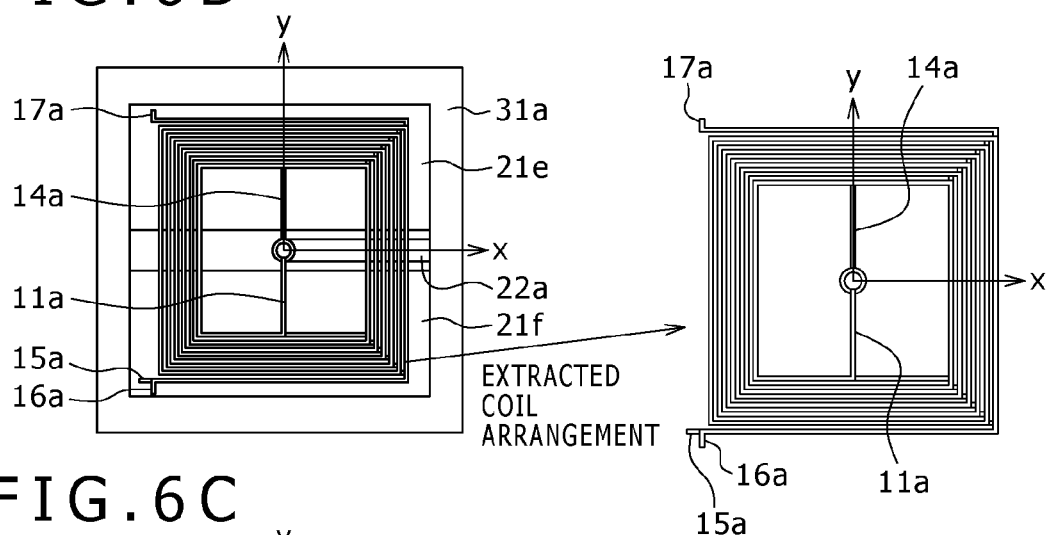
Figure 6C:
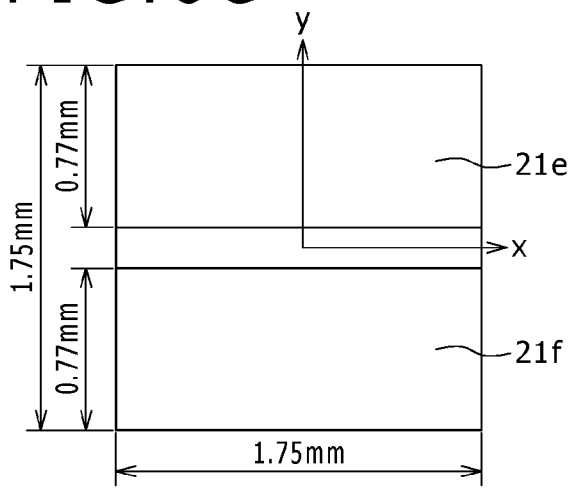

FIGS. 6A to 6C are plan views of each layer showing an example of the structure of the balun transformer of the embodiment. FIG. 6A is a plan view of the ferrite 21d constituting the uppermost layer of the balun transformer, FIG. 6B is a plan view excluding the uppermost ferrite 21d, and FIG. 6C is a plan view of the ferrites 21e and 21f formed under the fourth coil 14a.

The ferrite 21d shown in FIG. 6A has an area of 1.75 mm×1.75 mm which is broader than the area of the first coil 11a.

As shown in FIGS. 6B and 6C, the ferrites 21e and 21f having an area of 0.77 mm×1.75 mm are formed under the fourth coil 14a, interposing therebetween the copper post 25a electrically connecting the inner ends of the first to fourth coils 11a to 14a.

FIGS. 7A to 7D are plan views showing the planes including each coil layer of the balun transformer of the embodiment of the invention.

As shown in FIGS. 5A and 5B and FIGS. 7A to 7D, the first to third coils 11a to 13a are wound in the same direction (clockwise direction), and the fourth coil 14a is wound in the opposite direction to the above-described same direction. A width, thickness, pitch, and the number of turns of conductor constituting each coil are the same.

Figure 7A:
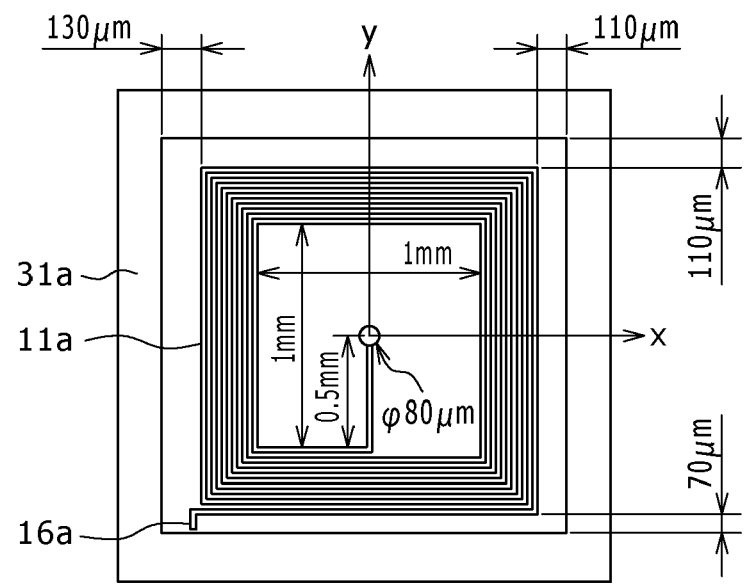
FIGS. 7A to 7E are plan views showing an example of the structure of a plane including each layer coil of the balun transformer.

As shown in FIG. 7A, the first coil 11a is formed inner than GND 31a, one end thereof being a land of 80 μm in diameter formed in a central area in an area of 1 mm×1 mm, and the outer periphery thereof being spaced from the inner periphery of GND 31a by 110 μm in the positive x-axis direction, by 130 μm in the negative x-axis direction, by 110 μm in the positive y-axis direction, and by 70 μm in the negative y-axis direction.

Figure 7B:
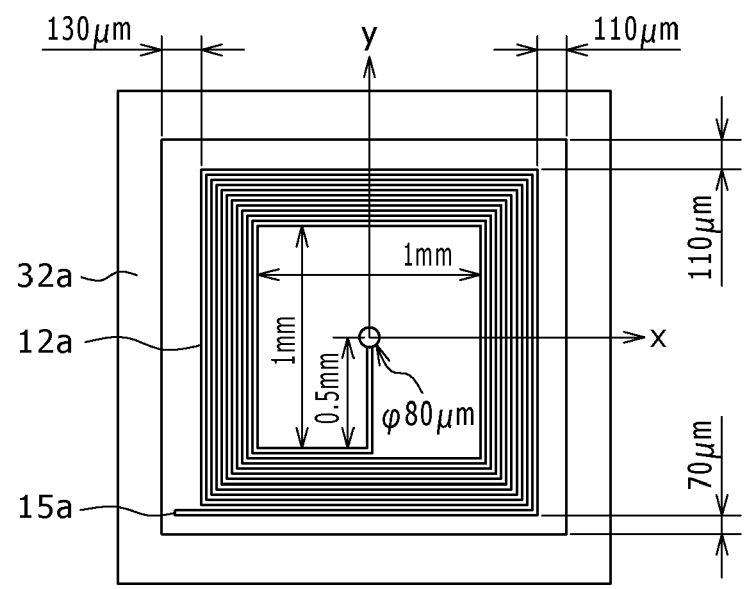

As shown in FIG. 7B, the second coil 12a is formed inner than GND 32a, one end thereof being a land of 80 μm in diameter formed in a central area in an area of 1 mm×1 mm, and the outer periphery thereof being spaced from the inner periphery of GND 32a by 110 μm in the positive x-axis direction, by 130 μm in the negative x-axis direction, by 110 μm in the positive y-axis direction, and by 70 μm in the negative y-axis direction.

Figure 7C:
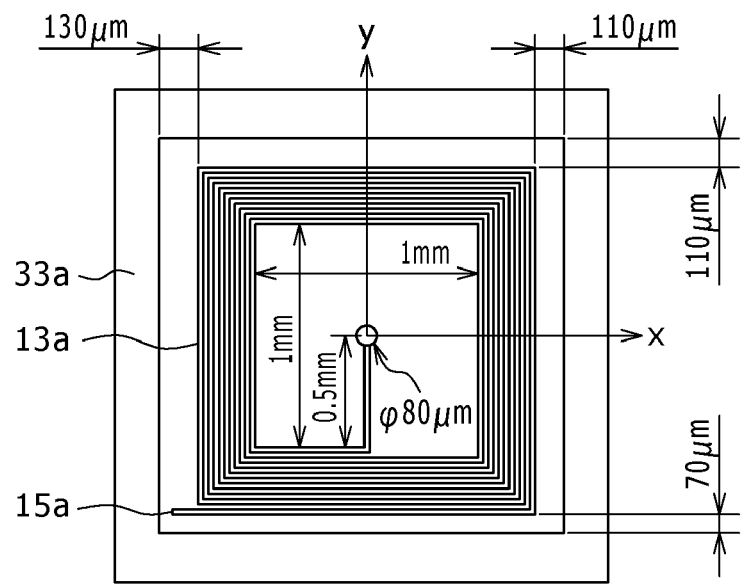

As shown in FIG. 7C, the third coil 13a is formed inner than GND 33a, one end thereof being a land of 80 μm in diameter formed in a central area in an area of 1 mm×1 mm, and the outer periphery thereof being spaced from the inner periphery of GND 33a by 110 μm in the positive x-axis direction, by 130 μm in the negative x-axis direction, by 110 μm in the positive y-axis direction, and by 70 μm in the negative y-axis direction.

Figure 7D:
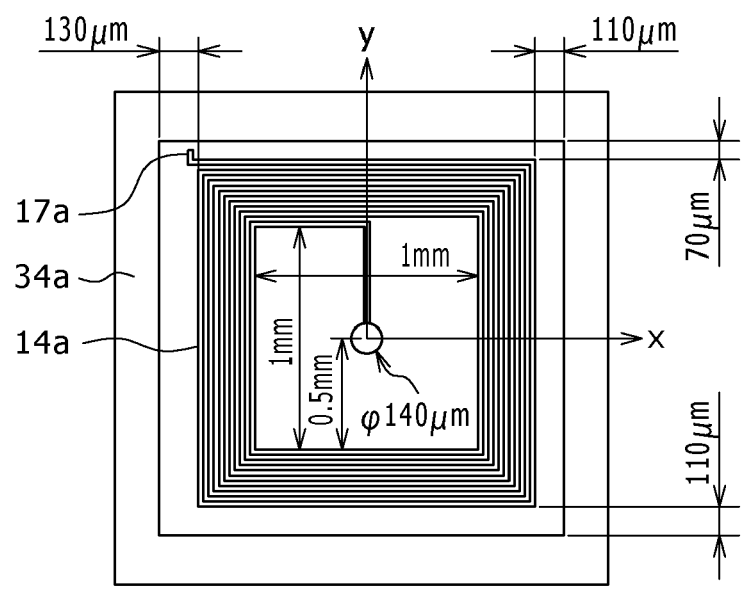

As shown in FIG. 7D, the fourth coil 14a is formed inner than GND 34a, one end thereof being a land of 80 μm in diameter formed in a central area in an area of 1 mm×1 mm, and the outer periphery thereof being spaced from the inner periphery of GND 34a by 110 μm in the positive x-axis direction, by 130 μm in the negative x-axis direction, by 70 μm in the positive y-axis direction, and by 110 μm in the negative y-axis direction.

Figure 7E:
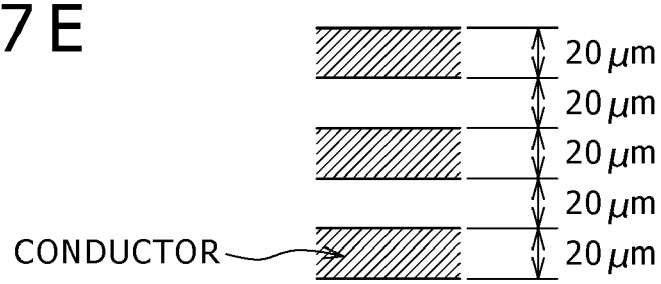

FIG. 7E is a schematic diagram showing a conductor width (conductor line width) and a conductor pitch (conductor line pitch) of each of the first to fourth coils 11a to 14a. A conductor line thickness of 20 μm, a conductor line width is 20 μm, a conductor line pitch is 20 μm and a line/space is 20 μm/20 nm.

GND's 31a to 34a have each an inner periphery of a length of 1.68 mm along the x-axis and a length of 1.66 mm along the y-axis, a conductor layer thickness of 20 μm and a conductor layer width of 50 μm or wider.

Figure 8A:
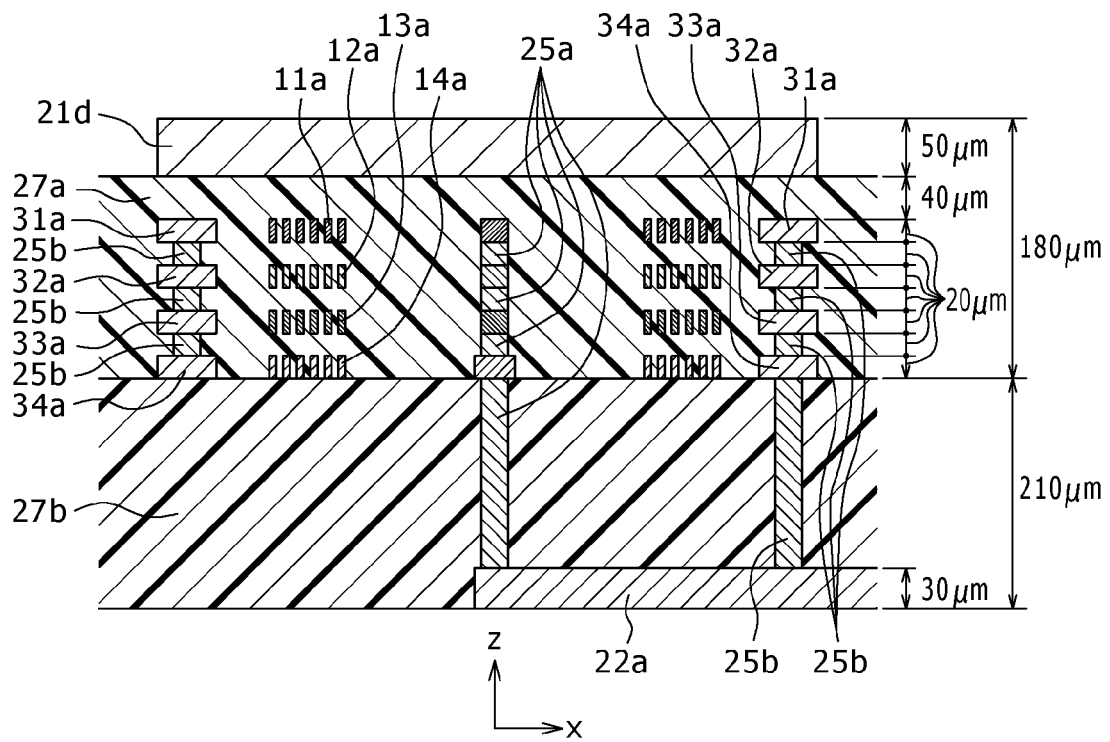
FIGS. 8A and 8B are cross sectional views showing an example of the structure and mounting structure of the balun transformer, FIG. 8A an xz cross sectional view
Figure 8B:
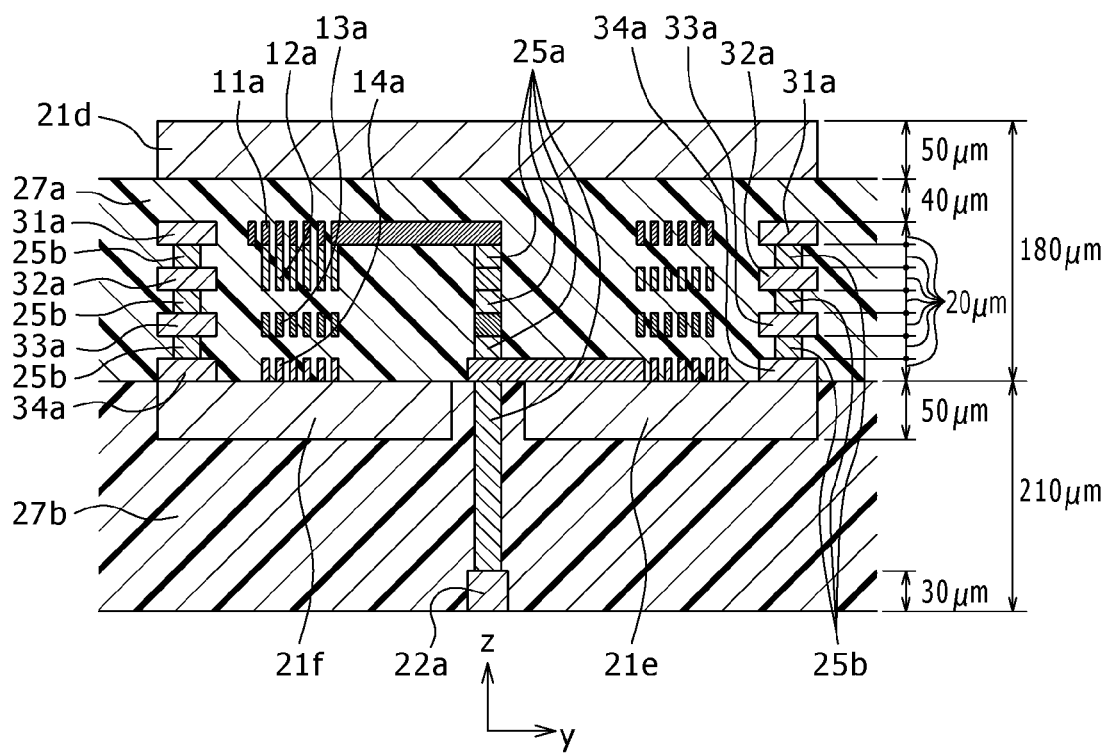

FIGS. 8A and 8B are cross sectional views showing an example of the structure of the balun transformer and an example of the mounting structure for the balun transformer, according to the embodiment of the present invention. FIG. 8A is an xz cross sectional view and FIG. 8B is a yz cross sectional view.

As shown in FIGS. 8A and 8B, the ferrite 21d, insulating resin 27a, first coil 11a, insulating resin 27a, second coil 12a, insulating resin 27a, third coil 13a, insulating resin 27a, fourth coil 14a, ferrites 21e and 21f, insulating resin 27b and substrate wiring 22a are sequentially stacked on the mother mounting substrate 24a from the upper layer toward the lower layer.

A thickness of the ferrite 21d is 50 μm, a thickness of the insulating resin 27a adjacent to the ferrite 21d is 40 μm, each of the first coil 11a, insulating resin 27a, second coil 12a, insulating resin 27a, third coil 13a, insulating resin 27a and fourth coil 14a has a thickness of 20 μm, the substrate wiring 22a has a thickness of 30 μm and the insulating resin 27b has a thickness of 210 μm.

The inner ends of the first to fourth coils 11a to 14a are electrically connected by the copper post 25a, and electrically connected and grounded to the substrate wiring 22a formed on the mother mounting substrate 24a.

GND's 31a to 34a respectively formed on the outer peripheries of the first to fourth coils 11a to 14a are electrically connected by a copper post 25b, and electrically connected and grounded to the substrate wiring 22a formed on the mother mounting substrate 24a.

In FIGS. 5A to 8B, a conductor line thickness of each of the first to fourth coils 11a to 14a is 20 μm, a conductor line width is 20 μm, a conductor line pitch is 20 μm, and a line/space is 20 μm/20 μm. The insulating resin 27a has a relative dielectric constant of 3.0 and a tangent dielectric constant (tan δ) of 0.008 (at 1 MHz to 10 GHz). A height of the land formed at the inner end of the lowermost fourth coil 14a and a height of the copper post 25a electrically connecting the substrate wiring 22a are 210 μm.

A thickness of the insulating resin (molding resin) 27b embedded between the lowermost fourth coil 14a and the mother mounting substrate 24a (not shown in FIG. 8) is 210 μm, and a relative dielectric constant thereof is 3.3 and the tangent dielectric constant (tan δ) is 0.08 (at 1 MHz to 10 GHz).

The input/output terminals shown in FIG. 5A to 7E (the first terminal 15a electrically connecting the outer ends of the second and third coils 12a and 13a, the second terminal 16a electrically connecting the outer end of the first coil 11a, and the third terminal 17a electrically connecting the outer end of the fourth coil 14a) are electrically connected to the substrate wiring terminals for signal input/output formed on the mother mounting substrate 24a, via through conductors extending through partial regions of the balun transformer and formed by copper post, via or the like not shown in FIGS. 8A and 8B.

In the structure of the balun transformer described above, as shown in FIGS. 5A to 8B, the ferrite 21d, first coil 11a, insulating resin 27a, second coil 12a, insulating resin 27a, third coil 13a, insulating resin 27a, fourth coil 14a, ferrites 21e and 21f, insulating resin 27b and substrate wiring 22a are sequentially stacked in this order from the upper layer toward the lower layer.

In the structure described above, the ferrite 21d is stacked via the insulating resin 27a upon the first coil 11a, and the ferrites 21e and 21f are stacked adjacent to the fourth coil 14a. The ferrites 21e and 21f and the substrate wiring 22a are constituted as part of the balun transformer.

The substrate wiring 22a is a wiring for electrically connecting the conductive wiring from the inner end of each coil constituting the balun transformer and the conductive lines formed on the mother molding substrate 24a, and may be formed as part of the balun transformer or may be formed on the side of the mother molding substrate 24a.

In the example shown in FIGS. 5A to 8B, although the sizes of some components are written in the drawings, a balun transformer having two sides of 2 mm or shorter and a height of 0.4 mm or lower can also be formed.

Figure 9:
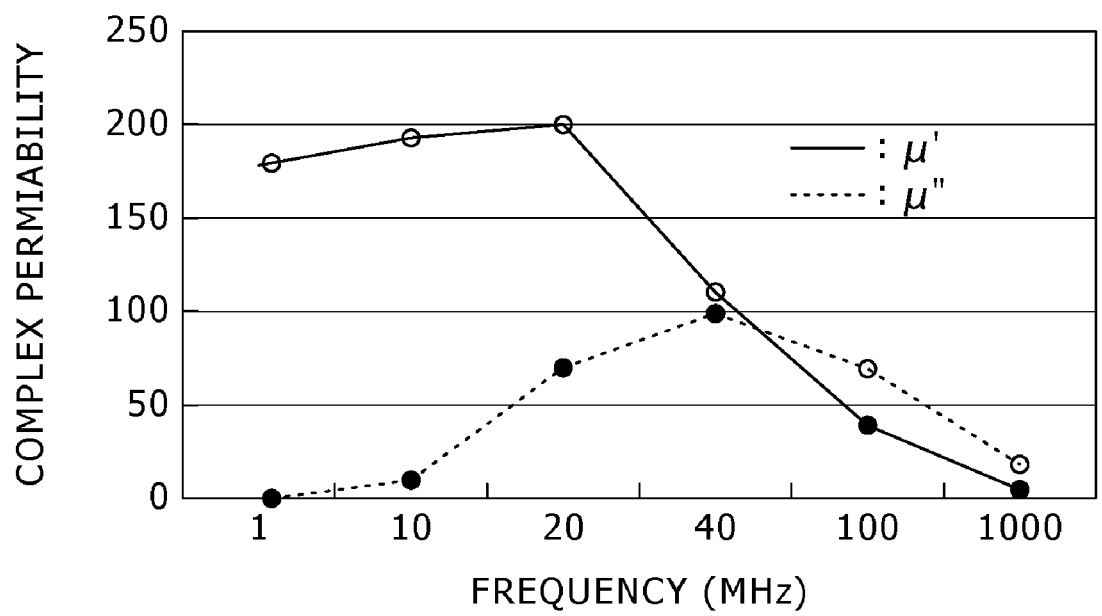
FIG. 9 is a graph showing the frequency characteristics of ferrite.

FIG. 9 is a graph showing the frequency characteristics of ferrite used in the embodiments of the present invention. The frequency characteristics of a complex permeability ($\mu'$, $\mu''$) of ferrite use catalog values (product TFG952 manufactured by Toda Kogyo Corp.).

The frequency characteristics shown in FIG. 9 indicate that an operation frequency of the balun transformer can be lowered by the effects of magnetic material, and an applied frequency band can be lowered.

Next, with reference to FIGS. 10A to 11B4, description will be made on examples of the characteristics of the balun transformer according to the embodiment of the present invention.

Figure 10A:
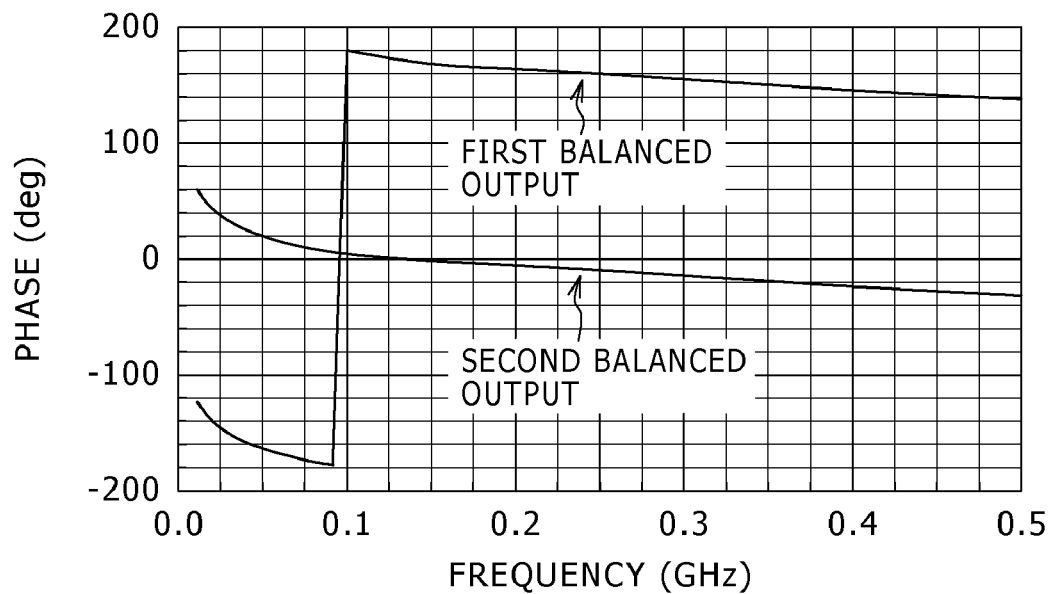
Figure 10B:
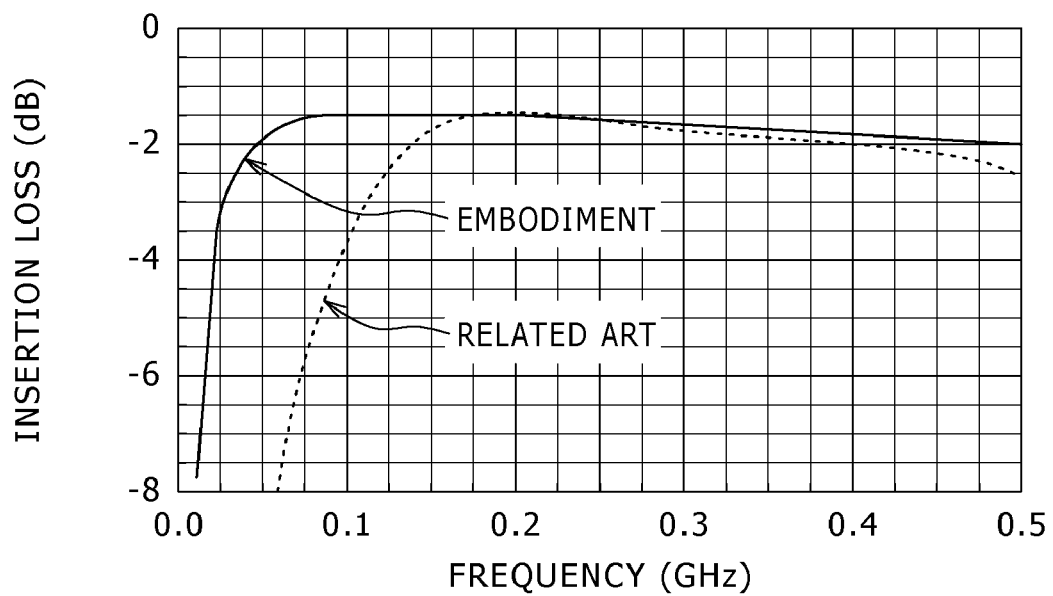

FIGS. 10A and 10B are graphs illustrating examples of the characteristics of the balun transformer according to the embodiment of the present invention.

FIGS. 11A1 to 11B3 are diagrams illustrating the calculation conditions for balun transformer characteristics according to the embodiment of the present invention.

The results shown in FIGS. 10A and 10B are calculation results obtained by three-dimensional electromagnetic field simulation (using HFSS Ver 10.1 of Ansoft Japan K.K.) using the finite element method. Simulation was conducted for the embodiment structure and a related art structure shown in FIGS. 11a1 to 11B3 (refer to FIGS. 5A to 9 for the structure shown in FIGS. 11A1 to 11A4).

FIGS. 11A1 to 11A4 are plan views of the balanced coils and unbalanced coils shown in FIGS. 7A to 7E. FIG. 11a1 shows the first coil including the first balanced coil 11a and GND 31a, FIG. 11A2 shows the second coil including the first unbalanced coil 12a and GND 32a, FIG. 11A3 shows the third coil including the second unbalanced coil 13a and GND 33a, and FIG. 11A4 shows the fourth coil including the second balanced coil 14a and GND 34a.

In this embodiment, as described earlier, the balun transformer is constituted of the stacked first to fourth coils (FIGS. 11A1 to 11A4). The inner ends of the first and second balanced coils 11a and 14a and the first and second unbalanced coils 12a and 13a are connected to the common reference GND. The first terminal 15a commonly connecting the outer ends of the first and second unbalanced coils 12a and 13a is used as the unbalanced signal input/output terminal. The second terminal 16a (the outer end of the first balanced coil 11a) is used as the first balanced signal input/output terminal, and the third terminal 17a (the outer end of the second balanced coil 14a) is used as the second balanced signal input/output terminal.

An inner size of the first and second balanced coils 11a and 14a and first and second unbalanced coils 12a and 13a is 1 mm square. The first balanced coil 11a, first unbalanced coil 12a and second unbalanced coil 13a are wound in the same direction, and the second balanced coil 14a is wound in the opposite direction to the above-described same direction. A width of a conductor line constituting each of the first and second balanced coils 11a and 14a and first and second unbalanced coils 12a and 13a is 20 μm, and a conductor line pitch is 20 μm and a line/space is 20 μm/20 μm.

FIGS. 11B1 to 11B3 are plan views showing balanced coils and unbalanced coils in an example of a related art structure, and FIG. 11B4 shows an equivalent circuit of the balun transformer according to an example of the related art structure.

As shown in FIG. 11B3, an inner size of first and second unbalanced coils 12c and 13c and first and second balanced coils 11c and 14c is 1 mm square. The first and second unbalanced coils 12c and 13c and the first and second balanced coils 11c and 14c are wound in the same direction (the number of turns is 15). A width of a conductor line constituting each coil is 20 μm, and a conductor line pitch is 20 μm and a line/space is 20 μm/20 μm.

The number of turns of each of the coils 11c to 14c shown in FIGS. 11B1 to 11B4 is twice or larger than that of each of the coils 11a to 14a shown in FIGS. 11A1 to 11A4.

In the example of the related art structure, the balun transformer is constituted of stacked first and second layer coils. The first layer coil is constituted of the first and second unbalanced coils 12c and 13c formed in the same layer and spaced by 0.1 mm, and the second layer coil is constituted of the first and second balanced coils 11c and 14c formed in the same layer and spaced by 0.1 mm.

As shown in FIG. 11B1, the first and second unbalanced coils 12c and 13c are formed in an area (2.48 mm×4.76 mm) surrounded by GND 32b. An inner end 12c-2 of the first unbalanced coil 12c and an inner end 13c-2 of the second unbalanced coil 13c are connected together (indicated by a broken line in FIG. 11B1), and an outer end 13c-1 of the second unbalanced coil 13c is connected to a reference GND.

As shown in FIG. 11B2, the first and second balanced coils 11c and 14c are formed in an area (2.48 mm×4.76 mm) surrounded by GND 31b. An outer end 11c-1 of the first balanced coil 11c and an outer end 14c-1 of the second balanced coil 14c are connected to the reference GND.

As shown in the equivalent circuit of FIG. 11B4, in the example of the related art structure, the balun transformer is constituted of stacked first and second layer coils. An outer end 12c-1 of the first unbalanced coil 12c is used as the unbalanced signal input/output terminal for an unbalanced signal S1a, an inner end 11c-2 of the first balanced coil 11c is used as a first balanced signal input/output terminal for a balanced signal S2a, and an inner end 14c-2 of the second balanced coil 14c is used as a second balanced signal input/output terminal for a balanced signal S2b.

FIG. 10A is a graph showing a phase of a first balanced output at a second terminal 16a and a phase of a second balanced output at a third terminal 17a, when an unbalanced signal is input to a first terminal 15a. FIG. 10B is a graph showing pass characteristics in which a solid line shows the pass characteristics of the embodiment and a dotted line shows the pass characteristics of the related art.

It can be seen from FIG. 10A that as an unbalanced signal is input to the first terminal (unbalanced signal input/output terminal) 15a, a phase difference is 180° between an output signal from the second terminal (first balanced signal input/output terminal) 16a and an output signal from the third terminal (second balanced signal input/output terminal) 17a. As seen from the solid line in FIG. 10B, an insertion loss is −2 dB or lower in the range from 50 MHz to 500 MHz, showing good performance of the balun transformer.

It becomes apparent from the comparison between the solid line and dotted line in FIG. 10B that the pass characteristics (indicated by the dotted line) of the example of the related art structure having a large coil size (a large number of turns) has a larger loss of the pass characteristics in the low frequency band than that of the embodiments, and that the example of the related art structure cannot cover the low frequency range. The pass characteristics (indicated by the solid line) of the embodiment are good and can cover the low frequency range.

Figure 12A:
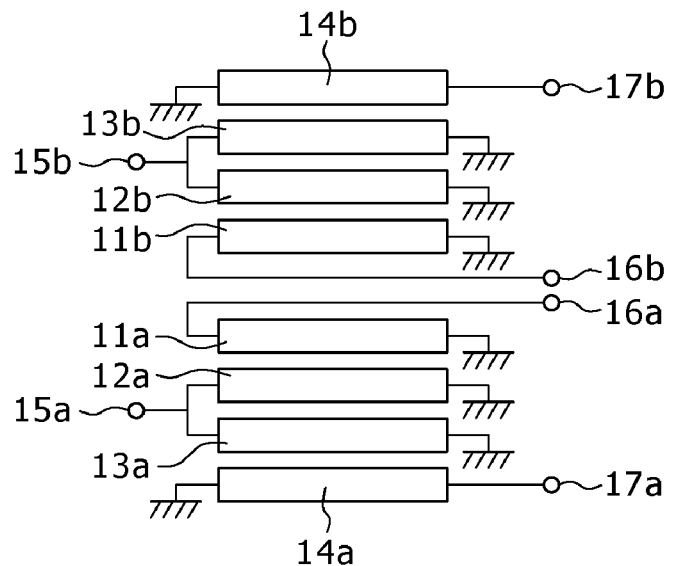
Figure 12B:
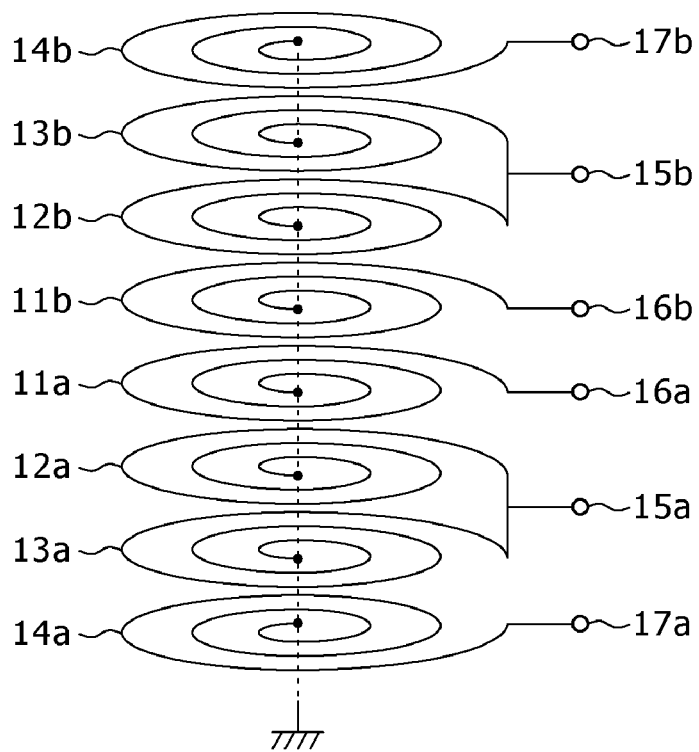

FIGS. 12A and 12B are diagrams showing the structure of a balun transformer according to a modification of the embodiment of the present invention. FIG. 12A shows an equivalent circuit, and FIG. 12B is a perspective view showing an example of the structure of coils of the balun transformer.

As shown in FIGS. 12A and 12B, the balun transformer according to the modification has a first set of coils and a second set of coils having the structure similar to that of the coils constituting the balun transformer shown in FIG. 1.

The first set of coils has a first coil (first balanced coil) 11a, a second coil (first unbalanced coil) 12a, a third coil (second unbalanced coil) 13a, a fourth coil (second balanced coil) 14a, a first terminal (unbalanced signal input/output terminal) 15a, a second terminal (first balanced signal input/output terminal) 16a and a third terminal (second balanced signal input/output terminal) 17a, respectively disposed from the upper layer toward the lower layer.

The second set of coils has a first coil (first balanced coil) 11b, a second coil (first unbalanced coil) 12b, a third coil (second unbalanced coil) 13b, a fourth coil (second balanced coil) 14b, a first terminal (unbalanced signal input/output terminal) 15b, a second terminal (first balanced signal input/output terminal) 16b and a third terminal (second balanced signal input/output terminal) 17b, respectively disposed from the lower layer toward the upper layer.

The first coil 11a of the first set is disposed facing the first coil 11b of the second set.

FIGS. 13A and 13B are a perspective view showing an example of the layout of coils of the balun transformer according to the modification of the embodiment of the present invention, and a schematic diagram of the balun transformer.

As shown in the schematic diagram and perspective view of FIGS. 13A and 13B, the inner ends of the first to fourth coils 11a to 14a and 11b to 14b are electrically connected in common, electrically connected to a substrate wiring formed on a mother mounting substrate, and electrically connected to a reference GND. Although not shown in FIGS. 13A and 13B, other structures are similar to the above-described embodiments, such as each coil being surrounded by GND (ground electrode layer). The second terminals 16a and 16b are disposed along the negative y-axis, and the third terminals 17a and 17b are disposed along the positive y-axis. Parasitic capacitance will not be formed between the second terminal 16a and third terminal 17a and between the second terminal 16b and third terminal 17b.

Figure 13:
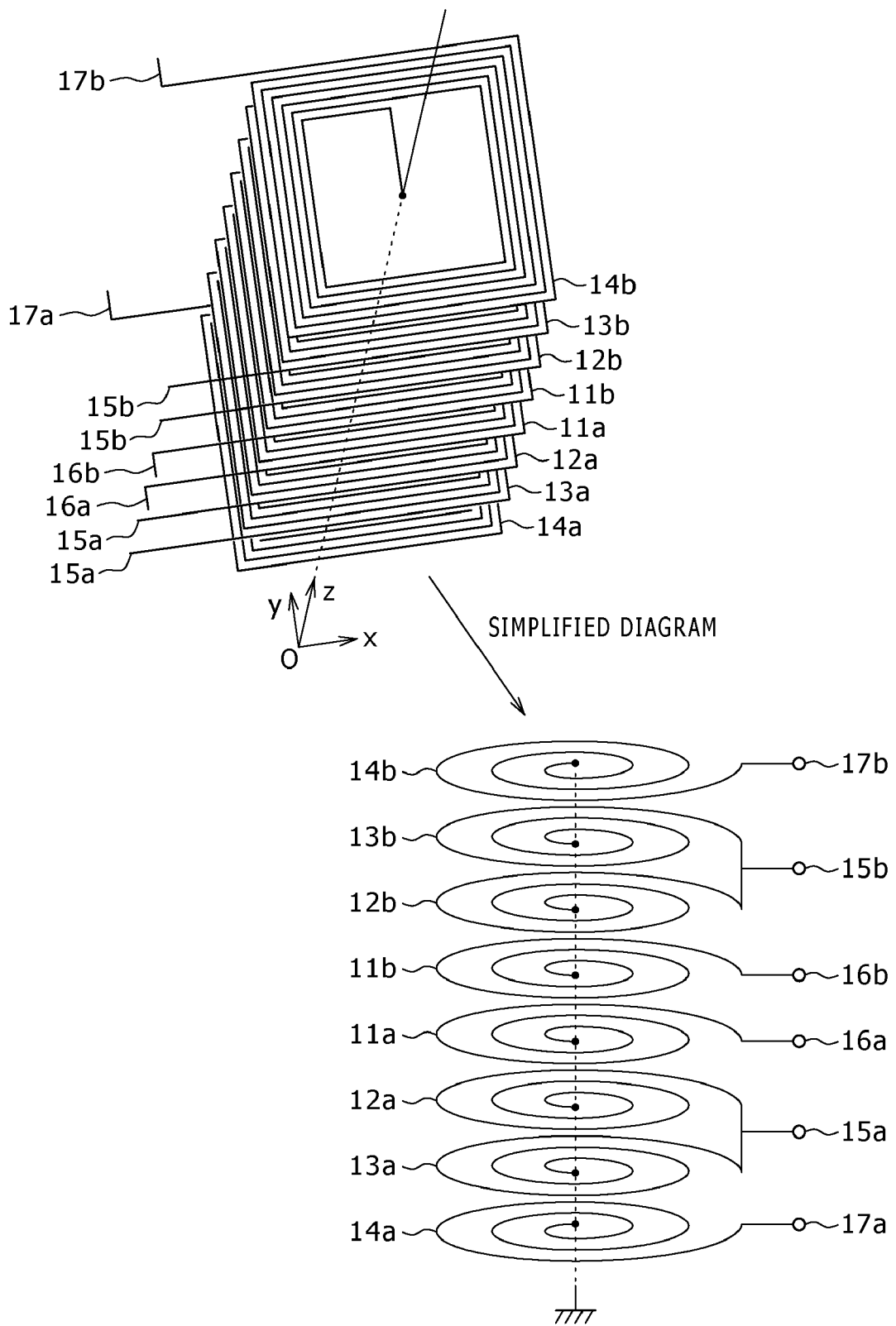
FIG. 13 is a perspective view showing an example of the layout of coils of the balun transformer on the modification.

According to the modification of the balun transformer having the structure shown in FIGS. 12A to 13, the coils of the balun transformer has two unbalanced signal input/output terminals and four balanced signal input/output terminals. Signal processing of inputting two unbalanced signals and outputting four balanced signal or vice versa can be performed so that balance-unbalance signal conversion processes can be executed in parallel at the same time.

For example, parallel signal processing can be performed, such as conversion of balanced signals into unbalanced signals by the first and second coil sets, and conversion of balanced signals into an unbalanced signal by the first coil set and an unbalanced signal into balanced signals by the second coil set.

According to the modification described above, although there is an increase in a thickness of the space where coils of a balun transformer are formed, the balun transformer can be formed without broadening the area where coils of a balun transformer are formed, and balance-unbalance signal conversion can be executed in parallel.

Figure 14:
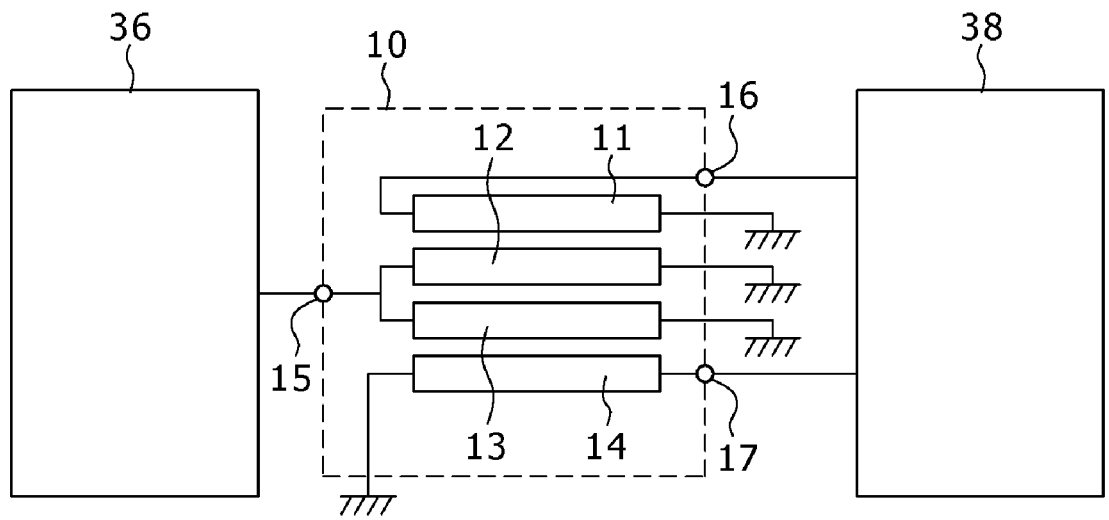
FIG. 14 is a diagram showing an example of an electronic apparatus having a built-in balun transformer mounting structure.
Figure 15:
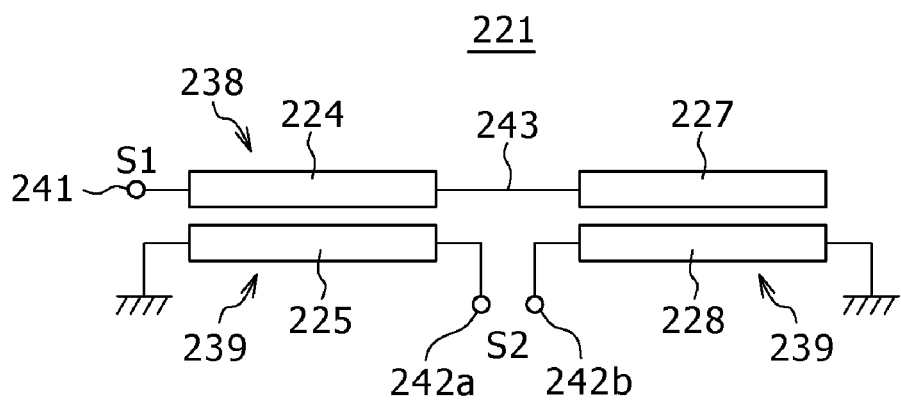
FIG. 15 shows an equivalent circuit of a balun transformer according to a related art.
Figure 16A:
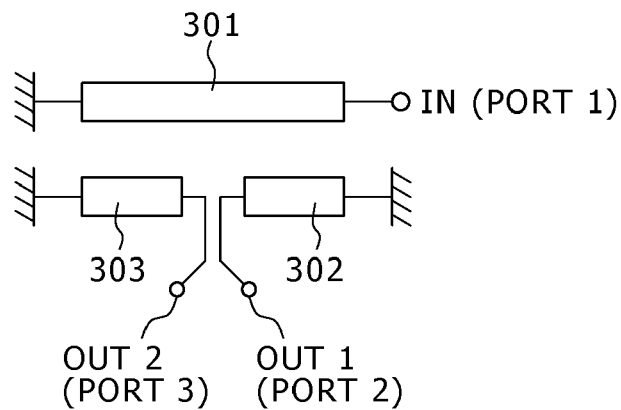
FIGS. 16A to 16C are circuit diagrams showing examples of a balun transformer according to the related art.
Figure 16B:
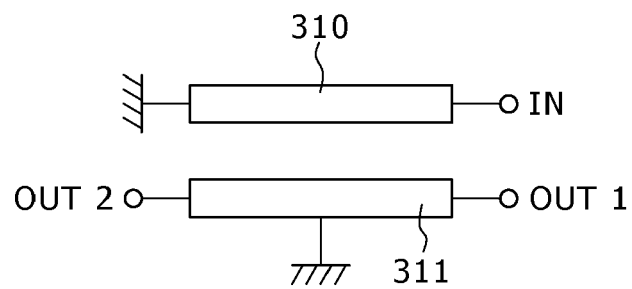
Figure 16C:
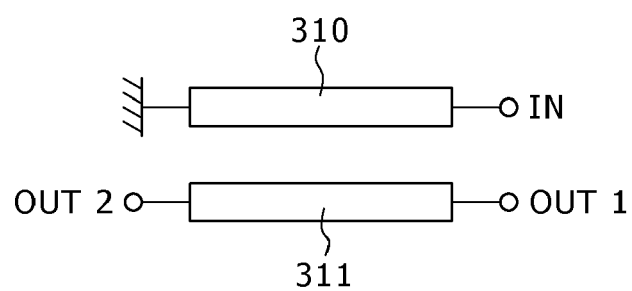

FIG. 14 is a diagram showing an example of an electronic apparatus having a built-in mounting structure for a balun transformer according to an embodiment of the present invention.

The balun transformer of the embodiment descried above can be mounted on various electronic apparatus. As shown in FIG. 14, an output signal from a circuit 36 outputting an unbalanced signal is input to the first terminal (unbalanced signal input/output terminal) 15. Balanced signals converted and generated by the balun transformer are output from the second terminal (first balanced signal input/output terminal) 16 and third terminal (second balanced signal input/output terminal) 17 to a circuit 38 to which balanced signal are input. This circuit 38 can execute desired signal processing.

Conversely, balanced signal output from the circuit 38 are input to the second and third terminals 16 and 17 of the balun transformer, and an unbalanced signal converted and generated by the balun transformer is output to the circuit 36. The circuit 36 can execute desired signal processing.

As described above, the balun transformer of the present invention can be manufactured as a semiconductor or ceramic substrate or the like having four or more thin film layers formed by thin film processes. A coil is formed in each thin film layer. The coils of the first to third layers from the uppermost layer are wound in the same direction, and the coil of the fourth layer is wound in the opposite direction to the above-described same direction. The center ends (inner ends) of the coils of the first to fourth layers are electrically connected by via holes or through holes. The mounting land formed inside the lowermost fourth layer is electrically connected to a conductive wiring formed on a print substrate (mounting substrate) to which the balun transformer is mounted, and electrically wired and grounded to the reference GND.

The ferrite having a larger size (e.g., larger by about 100 μm than the first layer coil) than that of the first layer coil is mounted above the first layer coil, and the other ferrite is mounted on the lowermost fourth layer coil. This other ferrite is separated at least in a partial area, e.g., into two parts, so as not to interfere the GND wiring.

In the method of stacking the coils of the balun transformer, one of the coils of a differential input/output side (i.e., first and second balanced coils) is formed as the uppermost layer and the other is formed as the lowermost layer. The coils of a single input/output side (i.e., first and second unbalanced coils) are formed between the coils of the differential input/output side.

Namely, the first balanced coil, first unbalanced coil, second unbalanced coil and second unbalanced coil, or the second balanced coil, second unbalanced coil, first unbalanced coil and first balanced coil are stacked in this order from the uppermost layer toward the lowermost layer. The first and second unbalanced coils are electrically connected in parallel.

With this arrangement, inductance on the single input/output side increases so that the coupling degree of the coils on the differential input/output side is improved.

As described so far, according to the present invention, a compact broadband balun transformer can be formed. Although a balun transformer is required to be prepared for each desired band in the past, the present invention realizes a broadband so that the number of components can be reduced and a manufacture cost can be reduced. Various electronic apparatus can be manufactured at low cost. A balun transformer can be built in and mounted in an electronic apparatus, by sequentially forming each layer constituting the balun transformer in or on the surface of a substrate (formed with a high frequency circuit and the like) constituting the electronic apparatus.

Each layer constituting the balun transformer can be formed by utilizing various techniques used for manufacturing a semiconductor device and a component having a multilayer wiring structure. A balun transformer having suitable characteristics can be manufactured by using conductive material and dielectric material suitable for a frequency or frequency band in use.

The embodiments of the present invention have been described above. The present invention is not limited to the embodiments described above but various modifications, improvements and the like based on the technical concept of the present invention are possible. For example, for the insulating resin constituting the dielectric layer of the balun transformer, dielectric material is selected in accordance with the relative dielectric constant and tangent dielectric constant. The dielectric material can be set arbitrarily and properly when necessary to match the frequency or frequency band in use and a target use field and achieve the target. Similarly, the length, width and thickness of conductor constituting each coil of the balun transformer can be set arbitrarily and properly when necessary to match the frequency or frequency band in use and a target use field and achieve the target.

As described above, the present invention can provide a compact broadband balun transformer usable as a balance-unbalance signal converter for converting balanced signals into a unbalanced signal or vice versa and a phase converter, particularly usable as a mobile communication apparatus such as a portable phone, a balun transformer mounting structure and an electronic apparatus having a built-in mounting structure.

According to the balun transformer of the present invention, the first to fourth layer coils are stacked and coupled magnetically; one end of each coil of the first to fourth layer coils is grounded; the second and third layer coils are connected in parallel, and an unbalanced signal is input/output to/from a common terminal of the second and third layer coils; a first balanced signal is input/output to/from the other end of the first layer coil; and a second balanced signal is input/output to/from the other end of the fourth layer coil. Accordingly, when the unbalanced signal is input to the common terminal of the second and third coils, a shift between the phase of the balanced signal output to the other end of the first layer coil and the phase of the balanced signal output to the other end of the fourth layer coil is hard to be occurred. It is therefore possible to improve the electrical characteristics, particularly phase balance characteristics, of the balun transformer.

According to the balun transformer mounting structure of the present invention, the balun transformer is mounted on a mounting substrate, and the one end of each coil of the balun transformer is connected to a ground wiring formed on the mounting substrate. Since the balun transformer is mounted on the mounting substrate, it is possible to mount the balun transformer on the mounting substrate being electrically connected by a shorter conductor and to reduce parasitic capacitance.

According to the electronic apparatus having a built-in balun transformer mounting substrate, the balun transformer is electrically connected to and mounted on the mounting substrate by a shorter conductor. It is therefore possible to provide an electronic apparatus which is compact, has a reduced parasitic capacitance and a balun transformer having good balance (amplitude and phase) characteristics.

It should be understood by those skilled in the art that various modifications, combinations, sub-combinations and alterations may occur depending on design requirements and other factors insofar as they are within the scope of the appended claims or the equivalents thereof.

CROSS REFERENCES TO RELATED APPLICATIONS

The present document contains subject matter related to Japanese Patent Application JP 2007-034865 filed in the Japanese Patent Office on Feb. 15, 2007, the entire contents of which being incorporated herein by reference.

What is claimed is:

1. A balun transformer, comprising:
first to fourth layer coils stacked in that order in respective layers and coupled together magnetically,
wherein,
each of the layer coils has a first end and second end, the first end being the innermost end of the coil,
the first end of each coil of the first to fourth layer coils is grounded,
the second and third layer coils are connected in parallel,
an unbalanced signal can be input or output or both to or from, respectively a common terminal of the second and third layer coils,
a first balanced signal can be input or output or both to or from, respectively, the second end of the first layer coil, and
a second balanced signal can be input or output or both to or from, respectively, the second end of the fourth layer coil.

2. The balun transformer according to claim 1, wherein the first to third layer coils are all wound in a first direction, and the fourth layer coil is wound in second direction opposite that of the first direction.

3. The balun transformer according to claim 1, wherein:
the each coil is stacked via a dielectric layer or a magnetic layer, and
the one end of the each coil is electrically connected via a via hole provided to the dielectric layer or the magnetic layer.

4. The balun transformer according to claim 1, further comprising a first magnetic layer facing or in contact with an outermost coil of the each coil.

5. The balun transformer according to claim 4, further comprising a dielectric layer or a magnetic layer interposed between the first magnetic layer and the outermost coil.

6. The balun transformer according to claim 1, further comprising a second magnetic layer facing or in contact with an innermost coil of the each coil.

7. The balun transformer according to claim 6, wherein at least part of the second magnetic layer is formed separately, and a wiring of the innermost coil passes through the separated part of the second magnetic layer.

8. The balun transformer according to claim 6, wherein a dielectric layer or a magnetic layer is interposed between the second magnetic layer and the innermost coil.

9. The balun transformer according to claim 1, further comprising first to fourth conductive layers formed surrounding outer peripheries of the first to fourth layer coils, respectively, and the first to fourth conductive layers are grounded.

10. The balun transformer according to claim 1, wherein:
   first and second coil sets each includes the first to fourth layer coils,
   the first coil set stacks the first to fourth layer coils in this order in a first direction,
   the second coil set stacks the first to fourth layer coils in this order in a second direction opposite to the first direction, and
   the first layer coil of the first coil set is stacked facing the first layer coil of the second coil set.

11. A balun transformer mounting structure, wherein:
   the balun transformer according to any one of claims 1 to 10 is mounted on a mounting substrate, and
   the one end of the each coil of the balun transformer is connected to a ground wiring formed on the mounting substrate.

12. The balun transformer mounting structure according to claim 11, wherein insulating resin is embedded between the each coil of the balun transformer and the ground wiring.

13. An electronic apparatus having the balun transformer mounting structure according to claim 11.

14. An electronic apparatus having the balun transformer mounting structure according to claim 12.

* * * * *